(12) United States Patent
Ebara et al.

(10) Patent No.: US 9,975,996 B2
(45) Date of Patent: May 22, 2018

(54) POSITIVE PHOTOSENSITIVE RESIN COMPOSITION AND POLYHYDROXYAMIDE RESIN

(71) Applicant: NISSAN CHEMICAL INDUSTRIES, LTD., Tokyo (JP)

(72) Inventors: Kazuya Ebara, Funabashi (JP); Hideo Suzuki, Funabashi (JP); Takayuki Tamura, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days. days.

(21) Appl. No.: 15/064,288

(22) Filed: Mar. 8, 2016

(65) Prior Publication Data

US 2016/0185905 A1    Jun. 30, 2016

Related U.S. Application Data

(63) Continuation of application No. 12/451,906, filed as application No. PCT/JP2008/059726 on May 27, 2008, now abandoned.

(30) Foreign Application Priority Data

Jun. 5, 2007 (JP) ................... 2007-149088

(51) Int. Cl.

| C08G 69/00 | (2006.01) |
| C08G 69/28 | (2006.01) |
| C08G 69/26 | (2006.01) |
| C08G 69/42 | (2006.01) |
| G03F 7/023 | (2006.01) |
| C08G 69/40 | (2006.01) |
| G03F 7/038 | (2006.01) |
| G03F 7/075 | (2006.01) |
| G03F 7/004 | (2006.01) |
| G03F 7/40 | (2006.01) |

(52) U.S. Cl.
CPC ............ C08G 69/28 (2013.01); C08G 69/26 (2013.01); C08G 69/265 (2013.01); C08G 69/40 (2013.01); C08G 69/42 (2013.01); G03F 7/0233 (2013.01); G03F 7/0387 (2013.01); G03F 7/0757 (2013.01); G03F 7/0045 (2013.01); G03F 7/40 (2013.01)

(58) Field of Classification Search
None
See application file for complete search history.

(56) References Cited

U.S. PATENT DOCUMENTS

| 3,449,296 | A | 6/1969 | Angelo et al. |
| 4,975,517 | A | 12/1990 | Hasegawa et al. |
| 5,240,819 | A | 8/1993 | Mueller et al. |
| 2008/0220222 | A1 | 9/2008 | Masayuki et al. |

(Continued)

FOREIGN PATENT DOCUMENTS

| JP | S49-86498 A | 8/1974 |
| JP | S58-55926 A | 4/1983 |
| JP | S62-135824 A | 6/1987 |

(Continued)

OTHER PUBLICATIONS

Kubota, Takashi et al. "Preparation of Fully Aromatic Polybenzoxazoles". Polymer Letters, vol. 2, pp. 655-659, 1964.

(Continued)

Primary Examiner — Rachel Kahn
(74) Attorney, Agent, or Firm — Oliff PLC

(57) ABSTRACT

A method for manufacturing a polyhydroxyamide resin (A) containing no chloride includes reacting a coumarin dimer component of Formula (19),

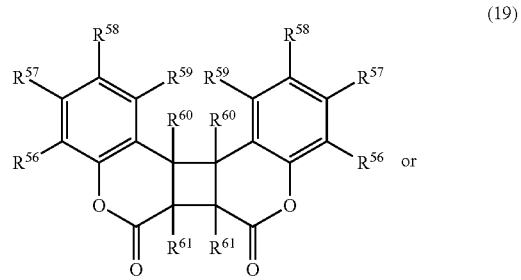

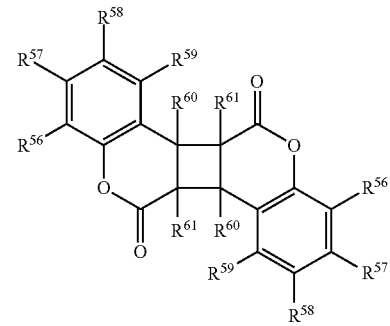

where $R^{56}$, $R^{57}$, $R^{58}$, $R^{59}$, $R^{60}$ and $R^{61}$ independently represent an alkyl group having 1 to 10 carbon atom(s), a halogen atom, a nitro group, an amino group, a cyano group, a carboxy group, an alkoxycarbonyl group having 1 to 10 carbon atom(s), a halogenated alkyl group having 1 to 10 carbon atom(s) or a hydroxy group, and a diamine in a polar solvent.

7 Claims, No Drawings

(56) References Cited

U.S. PATENT DOCUMENTS

2010/0119969 A1* 5/2010 Ebara .................... C08G 69/26
430/270.1

FOREIGN PATENT DOCUMENTS

| JP | H09-183846 A | 7/1997 |
|----|--------------|--------|
| JP | 2000-230049 A | 8/2000 |
| JP | 2002-341527 A | 11/2002 |
| JP | 2003-302761 A | 10/2003 |
| JP | 2005-049661 A | 2/2005 |

OTHER PUBLICATIONS

Jul. 1, 2008 International Search Report issued in International Application No. PCT/JP2008/059726.

* cited by examiner

POSITIVE PHOTOSENSITIVE RESIN COMPOSITION AND POLYHYDROXYAMIDE RESIN

This application is a continuation application of U.S. patent application Ser. No. 12/451,906 filed Dec. 4, 2009, which is the U.S. National Phase of PCT International Application No. PCT/JP2008/059726 filed May 27, 2008. The entire disclosures of the above applications are incorporated herein by reference.

TECHNICAL FIELD

The present invention relates to a positive photosensitive resin composition containing a polyhydroxyamide resin and a compound generating an acid by light irradiation, and the polyhydroxyamide resin. This resin composition is suitably utilized as a protecting film, an insulating film or the like for a semiconductor or a circuit board such as a printed board.

BACKGROUND ART

Application of a photosensitive resin insulating film produced from a photosensitive resin represented by a photosensitive polyimide resin having excellent mechanical properties and high heat resistance has been expanding, and starts to be spread not only in a semiconductor field but also in a display field, so that reliability on an insulating film which has never been required until today is required.

At present, many of positive photosensitive resin compositions used are produced by adding a photosensitive dissolution inhibitor (diazonaphthoquinone: DNQ) to a base material polymer. A positive pattern can be obtained by producing a coating film from this resin composition, followed by exposing the film to light through a mask, and dissolving the exposed part in tetramethylammoniumhydroxide (TMAH) which is a representative water-soluble alkaline developer.

Since a representative polyimide-based positive photosensitive resin composition has an excessively high solubility in TMAH, such a method is adopted that by reducing the acidity of a polyamide acid using a basic organic compound such as triethylamine, the dissolving rate of the composition in an alkaline developer is suppressed (Patent Document 1).

On the other hand, it is disclosed that since a polyhydroxyamide resin has an adequate solubility in TMAH, the resin is capable of being suitably utilized as a positive photosensitive resin composition (for example, Patent Document 2).

Examples of properties required to a positive photosensitive resin composition using a polyhydroxyamide resin include having film physical properties excellent in electric insulating properties, heat resistance, mechanical strength and the like, and being capable of forming a high-resolution circuit pattern. Recently, requirements for properties of these positive photosensitive resin compositions have become more rigid than ever.

Generally, a polyhydroxyamide resin is synthesized using a dicarboxylic acid chloride and dihydroxyamine under a basic condition (Non-patent Document 1). However, by this method, since inorganic ions such as chloride ions are present in the reaction solution, a polymer needs to be isolated and purified after the completion of the reaction. In addition, since inorganic ions are mixed in the positive photosensitive resin composition obtained, there is a problem that the inorganic ions cause corrosion when the positive photosensitive resin composition is used in an electronic material field.

For solving such a problem, there is disclosed a method for synthesizing a polyhydroxyamide using as a dicarboxylic acid component, a dicarboxylic acid derivative obtained from a reaction of 1-hydroxybenzotriazol with a dicarboxylic acid (Patent Document 3). However, since a leaving group derived from the dicarboxylic acid derivative is mixed in the reaction solution, a process for removing the leaving group becomes required, so that it is difficult to obtain a high-purity polyhydroxyamide.

On the other hand, there is also disclosed that a polyhydroxyamide resin synthesized from a coumarin dimer and a diamine is utilized as a negative photosensitive material (Patent Document 4).

However, until now, there has been no reported example for a composition containing a polyhydroxyamide resin and a compound generating an acid by light irradiation.

[Patent Document 1]
Japanese Patent Application Publication No. JP-A-62-135824
[Patent Document 2]
Japanese Patent Application Publication No. JP-A-2003-302761
[Patent Document 3]
Japanese Patent Application Publication No. JP-A-9-183846
[Patent Document 4]
Japanese Patent Application Publication No. JP-A-58-55926
[Non-patent Document 1]
Polymer Letter., Vol. 2, pp. 655-659 (1964)

DISCLOSURE OF THE INVENTION

Problems to be Solved by the Invention

In order to solve the problems described above, it is an object of the present invention to provide a positive photosensitive resin composition that is excellent in electric insulating properties, heat resistance, mechanical strength and electrical characteristics, and capable of forming a high-resolution circuit pattern.

In addition, it is another object of the present invention to provide a positive photosensitive resin that contains no chloride, low molecule compound or the like adversely affecting a semiconductor element, an electronic/electric circuit or the like, and can be simply synthesized.

Means for Solving the Problems

As a result of assiduous research intended to achieve the objects as described above, the present inventors found that a composition containing a polyhydroxyamide resin having a specific structure shown as follows (for example, a polyhydroxyamide resin synthesized from a coumarin dimer and a diamine having an aromatic group substituted with at least one OH group) and a compound generating an acid by light irradiation exhibits film physical properties excellent in terms of electric insulating properties, heat resistance, mechanical strength and the like. Furthermore, the present inventors found that when the composition is patterned as a positive photosensitive resin composition, a high-resolution circuit pattern can be formed, and completed the present invention.

That is, according to a first aspect of the present invention, a positive photosensitive resin composition is characterized by containing: at least one type of a polyhydroxyamide resin (A) containing a repeating unit represented by Formula (1):

[Chemical Formula 1]

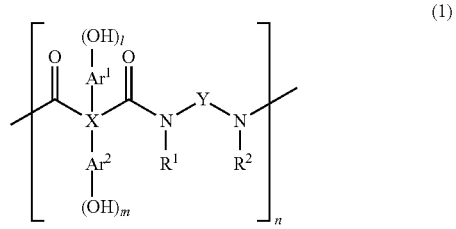

(1)

(where X represents a tetravalent aliphatic group or an aromatic group; $R^1$ and $R^2$ independently represent a hydrogen atom or an alkyl group having 1 to 10 carbon atom(s); $Ar^1$ and $Ar^2$ independently represent an aromatic group; Y represents an organic group containing an aromatic group substituted with at least one OH group; n represents an integer of 1 or more; and l and m independently represent an integer of 0 or 1 or more and satisfy 1+m≤2), and having a weight average molecular weight of 3,000 to 100,000; and a compound (B) generating an acid by light irradiation.

According to a second aspect, in the positive photosensitive resin composition according to the first aspect, the X represents an aliphatic group.

According to a third aspect, in the positive photosensitive resin composition according to the second aspect, the X represents an aliphatic group having a cyclic structure.

According to a fourth aspect, in the positive photosensitive resin composition according to any one of the first aspect to the third aspect, in the X, an X—$Ar^1$ bond and an X—C(O) bond are each bonded to an adjecent atom in the X, and an X—$Ar^2$ bond and another X—C(O) bond are each bonded to an adjacent atom in the X.

According to a fifth aspect, in the positive photosensitive resin composition according to the fourth aspect, in Formula (1), a group:

[Chemical Formula 2]

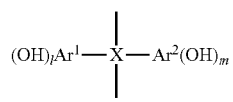

has a structure represented by Formula (2):

[Chemical Formula 3]

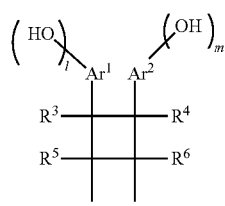

(2)

(where $Ar^1$, $Ar^2$, Y, l and m represent the same meaning as defined above; and $R^3$ to $R^6$ independently represent a hydrogen atom or an alkyl group having 1 to 10 carbon atom(s)).

According to a sixth aspect, in the positive photosensitive resin composition according to any one of the first aspect to the fifth aspect, the $Ar^1$ and the $Ar^2$ independently represent a benzene ring.

According to a seventh aspect, in the positive photosensitive resin composition according to the sixth aspect, the —$Ar^1(OH)_l$ group and the —$Ar^2(OH)_m$ group have a structure represented by Formula (3):

[Chemical Formula 4]

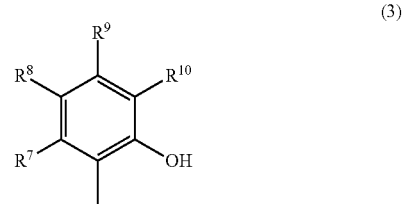

(3)

(where $R^7$ to $R^{10}$ independently represent a hydrogen atom, an alkyl group having 1 to 10 carbon atom(s), a haloalkyl group having 1 to 10 carbon atom(s), an alkoxy group having 1 to 10 carbon atom(s), a halogen atom, a nitro group, a formyl group, a cyano group, a carboxyl group, a phosphonyl group, a sulfonyl group, a phenyl group which may be substituted with $W^1$, a naphthyl group which may be substituted with $W^1$, a thienyl group which may be substituted with $W^1$ or a furyl group which may be substituted with $W^1$; and $W^1$ represents an alkyl group having 1 to 10 carbon atom(s), a haloalkyl group having 1 to 10 carbon atom(s), an alkoxy group having 1 to 10 carbon atom(s), a hydroxy group, a halogen atom, a nitro group, a formyl group, a cyano group, a carboxyl group, a phosphonyl group or a sulfonyl group).

According to an eighth aspect, in the positive photosensitive resin composition according to any one of the first aspect to the seventh aspect, the Y represents an organic group containing a benzene ring substituted with at least one OH group.

According to a ninth aspect, in the positive photosensitive resin composition according to the eighth aspect, the Y represents an organic group containing two or more benzene rings substituted with at least one OH group.

According to a tenth aspect, in the positive photosensitive resin composition according to the ninth aspect, the Y has a structure represented by Formula (4):

[Chemical Formula 5]

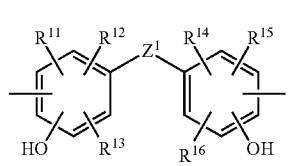

(4)

(where $R^{11}$ to $R^{16}$ independently represent a hydrogen atom, an alkyl group having 1 to 10 carbon atom(s), a haloalkyl group having 1 to 10 carbon atom(s), an alkoxy group having 1 to 10 carbon atom(s), a hydroxy group, a halogen atom, a nitro group, a formyl group, a cyano group, a carboxyl group, a phosphonyl group, a sulfonyl group, a phenyl group which may be substituted with $W^2$, a naphthyl group which may be substituted with $W^2$, a thienyl group which may be substituted with $W^2$ or a furyl group which may be substituted with $W^2$; $W^2$ represents an alkyl group having 1 to 10 carbon atom(s), a haloalkyl group having 1 to 10 carbon atom(s), an alkoxy group having 1 to 10 carbon atom(s), a hydroxy group, a halogen atom, a nitro group, a formyl group, a cyano group, a carboxyl group, a phosphonyl group or a sulfonyl group; $Z^1$ represents a single bond, an alkylene group having 1 to 10 carbon atom(s) which may be substituted with $W^3$, —C(O)O—, —C(O)NH—, —O—, —S—, —S(O)$_2$— or —C(O)—; and $W^3$ represents an alkyl group having 1 to 10 carbon atom(s), a haloalkyl group having 1 to 10 carbon atom(s) or an alkoxy group having 1 to 10 carbon atom(s)).

According to an eleventh aspect, in the positive photosensitive resin composition according to the tenth aspect, the $Z^1$ represents a single bond, —CH$_2$—, —C(CH$_3$)$_2$—, —C(CF$_3$)$_2$—, —C(O)NH—, —O—, —S(O)$_2$— or —C(O)—.

According to a twelfth aspect, in the positive photosensitive resin composition according to any one of the first aspect to the eleventh aspect, the polyhydroxyamide resin (A) further contains at least one type of a repeating unit represented by Formula (5):

[Chemical Formula 6]

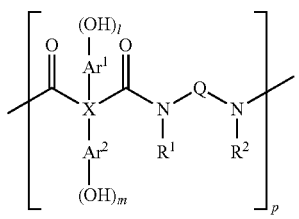

(5)

(where X, Ar$^1$, Ar$^2$, R$^1$, R$^2$, l and m represent the same meaning as defined above; Q represents a divalent organic group (with a proviso that the group contains no OH group); and p represents an integer of 1 or more).

According to a thirteenth aspect, in the positive photosensitive resin composition according to the twelfth aspect, the Q represents an organic group containing an aromatic group.

According to a fourteenth aspect, in the positive photosensitive resin composition according to the thirteenth aspect, the Q represents an organic group containing a benzene ring.

According to a fifteenth aspect, in the positive photosensitive resin composition according to the fourteenth aspect, the Q represents an organic group containing two or more benzene rings.

According to a sixteenth aspect, in the positive photosensitive resin composition according to the fifteenth aspect, the Q represents an organic group containing at least one repeating unit structure selected from Formula (6) to Formula (8):

[Chemical Formula 7]

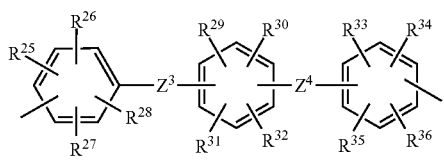

(6)

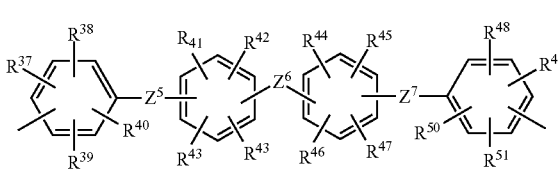

(7)

(8)

(in Formula (6), R$^{17}$ to R$^{24}$ independently represent a hydrogen atom, an alkyl group having 1 to 10 carbon atom(s), a haloalkyl group having 1 to 10 carbon atom(s), an alkoxy group having 1 to 10 carbon atom(s), a halogen atom, a nitro group, a formyl group, a cyano group, a carboxyl group, a phosphonyl group, a sulfonyl group, a phenyl group which may be substituted with $W^4$, a naphthyl group which may be substituted with $W^4$, a thienyl group which may be substituted with $W^4$ or a furyl group which may be substituted with $W^4$; and $W^4$ represents an alkyl group having 1 to 10 carbon atom(s), a haloalkyl group having 1 to 10 carbon atom(s), an alkoxy group having 1 to 10 carbon atom(s), a hydroxy group, a halogen atom, a nitro group, a formyl group, a cyano group, a carboxyl group, a phosphonyl group or a sulfonyl group, in Formula (7) and Formula (8), R$^{25}$ to R$^{51}$ independently represent a hydrogen atom, an alkyl group having 1 to 10 carbon atom(s), a haloalkyl group having 1 to 10 carbon atom(s), an alkoxy group having 1 to 10 carbon atom(s), a halogen atom, a nitro group, a formyl group, a cyano group, a carboxyl group, a phosphonyl group, a sulfonyl group, a phenyl group which may be substituted with $W^4$, a naphthyl group which may be substituted with $W^4$, a thienyl group which may be substituted with $W^4$ or a furyl group which may be substituted with $W^4$; and $W^4$ represents the same meaning as defined above, and in Formula (6) to Formula (8), $Z^2$ to $Z^7$ independently represent a single bond, an alkylene group having 1 to 10 carbon atom(s) which may be substituted with $W^5$, —C(O)O—, —C(O)NH—, —O—, —S—, —S(O)$_2$— or —C(O)—; and $W^5$ represents an alkyl group having 1 to 10 carbon atom(s), a haloalkyl group having 1 to 10 carbon atom(s) or an alkoxy group having 1 to 10 carbon atom(s)).

According to a seventeenth aspect, in the positive photosensitive resin composition according to the sixteenth aspect, in Formula (6) to Formula (8), $Z^2$ to $Z^7$ independently represent an alkylene group having 1 to 3 carbon atom(s), —O—, —S—, —S(O)$_2$— or —C(O)—.

According to an eighteenth aspect, in the positive photosensitive resin composition according to the seventeenth aspect, in Formula (6), $Z^2$ represents —O—. According to a nineteenth aspect, in the positive photosensitive resin composition according to the seventeenth aspect, in Formula (7), $Z^3$ and $Z^4$ represent —O—.

According to a 20th aspect, in the positive photosensitive resin composition according to the seventeenth aspect, in Formula (8), $Z^5$ and $Z^7$ represent —O— and $Z^6$ represents —S(O)$_2$—.

According to a 21st aspect, in the positive photosensitive resin composition according to any one of the first aspect to the 20th aspect, the polyhydroxyamide resin (A) further contains at least one type of a repeating unit represented by Formula (9):

[Chemical Formula 8]

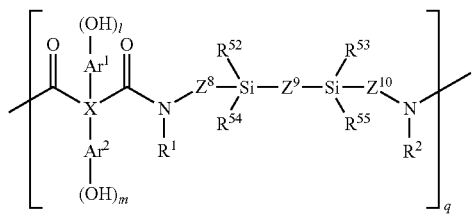

(where X, Ar$^1$, Ar$^2$, R$^1$, R$^2$, l and m represent the same meaning as defined above; R$^{52}$ to R$^{56}$ independently represent a hydrogen atom, an alkyl group having 1 to 10 carbon atom(s), a haloalkyl group having 1 to 10 carbon atom(s), an alkoxy group having 1 to 10 carbon atom(s), a halogen atom, a nitro group, a formyl group, a cyano group, a carboxyl group, a phosphonyl group, a sulfonyl group, a phenyl group which may be substituted with W$^6$, a naphthyl group which may be substituted with W$^6$, a thienyl group which may be substituted with W$^6$ or a furyl group which may be substituted with W$^6$; W$^6$ represents an alkyl group having 1 to 10 carbon atom(s), a haloalkyl group having 1 to 10 carbon atom(s), an alkoxy group having 1 to 10 carbon atom(s), a hydroxy group, a halogen atom, a nitro group, a formyl group, a cyano group, a carboxyl group, a phosphonyl group or a sulfonyl group; Z$^8$ to Z$^{10}$ independently represent a single bond, an alkylene group having 1 to 10 carbon atom(s) which may be substituted with W$^7$, —C(O)O—, —C(O)NH—, —O—, —S—, —S(O)$_2$— or —C(O)—; W$^7$ represents an alkyl group having 1 to 10 carbon atom(s), a haloalkyl group having 1 to 10 carbon atom(s) or an alkoxy group having 1 to 10 carbon atom(s); and q represents an integer of 1 or more).

According to a 22nd aspect, in the positive photosensitive resin composition according to the 21st aspect, in Formula (9), Z$^8$ to Z$^{10}$ independently represent an alkylene group having 1 to 3 carbon atom(s), —O—, —S—, —S(O)$_2$— or —C(O)—.

According to a 23rd aspect, in the positive photosensitive resin composition according to the 22nd aspect, in Formula (9), Z$^8$ and Z$^{10}$ represent a propylene group and Z$^9$ represents —O—.

According to a 24th aspect, in the positive photosensitive resin composition according to any one of the first aspect to the 23rd aspect, 0.01 to 100 parts by mass of the compound (B) generating an acid by light irradiation is contained based on 100 parts by mass of the polyhydroxyamide resin (A).

According to a 25th aspect, the positive photosensitive resin composition according to any one of the first aspect to the 24th aspect further contains a crosslinkable compound (C).

According to a 26th aspect, in the positive photosensitive resin composition according to the 25th aspect, 30 to 120 parts by mass of the crosslinkable compound (C) is contained based on 100 parts by mass of the polyhydroxyamide resin (A).

According to a 27th aspect, a positive photosensitive resin composition-containing varnish is characterized in that the positive photosensitive resin composition as described in any one of the first aspect to the 26th aspect is dissolved in at least one type of a solvent.

According to a 28th aspect, a cured film is produced by using the positive photosensitive resin composition as described in any one of the first aspect to the 26th aspect.

According to a 29th aspect, a cured film is produced by using the positive photosensitive resin composition-containing varnish as described in the 27th aspect.

According to a 30th aspect, a structure includes at least one layer formed by the cured film as described in the 28th aspect or the 29th aspect on a substrate.

According to a 31st aspect, a polyhydroxyamide resin contains a repeating unit represented by Formula (10):

[Chemical Formula 9]

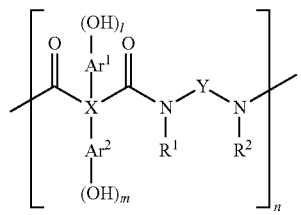

(where X represents a tetravalent aliphatic group or an aromatic group; R$^1$ and R$^2$ independently represent a hydrogen atom or an alkyl group having 1 to 10 carbon atom(s); Ar$^1$ and Ar$^2$ independently represent an aromatic group; Y represents an organic group containing an aromatic group substituted with at least one OH group; n represents an integer of 1 or more; and l and m independently represent an integer of 0 or 1 or more and satisfy 1+m≤2), and has a weight average molecular weight of 3,000 to 100,000.

According to a 32nd aspect, in the polyhydroxyamide resin according to the 31st aspect, the X represents an aliphatic group.

According to a 33rd aspect, in the polyhydroxyamide resin according to the 32nd aspect, the X represents an aliphatic group having a cyclic structure.

According to a 34th aspect, in the polyhydroxyamide resin according to any one of the 31st aspect to the 33rd aspect, in the X, an X—Ar$^1$ bond and an X—C(O) bond are each bonded to an adjacent atom in the X, and an X—Ar$^2$ bond and another X—C(O) bond are each bonded to an adjacent atom in the X.

According to a 35th aspect, in the polyhydroxyamide resin according to the 34th aspect, in Formula (10), a group:

[Chemical Formula 10]

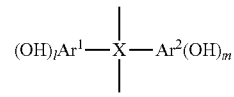

has a structure represented by Formula (11):

[Chemical Formula 11]

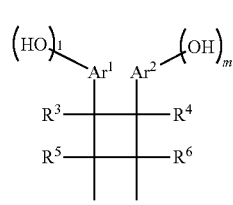

(where Ar$^1$, Ar$^2$, Y, l and m represent the same meaning as defined above; and R$^3$ to R$^6$ independently represent a hydrogen atom or an alkyl group having 1 to 10 carbon atom(s)).

According to a 36th aspect, in the polyhydroxyamide resin according to any one of the 31st aspect to the 35th aspect, the $Ar^1$ and the $Ar^2$ independently represent a benzene ring.

According to a 37th aspect, in the polyhydroxyamide resin according to the 36th aspect, the $—Ar^1(OH)_l$ group and the $—Ar^2(OH)_m$ group have a structure represented by Formula (12):

[Chemical Formula 12]

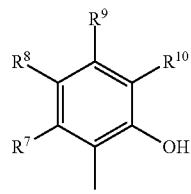

(12)

(where $R^7$ to $R^{10}$ independently represent a hydrogen atom, an alkyl group having 1 to 10 carbon atom(s), a haloalkyl group having 1 to 10 carbon atom(s), an alkoxy group having 1 to 10 carbon atom(s), a halogen atom, a nitro group, a formyl group, a cyano group, a carboxyl group, a phosphonyl group, a sulfonyl group, a phenyl group which may be substituted with $W^1$, a naphthyl group which may be substituted with $W^1$, a thienyl group which may be substituted with $W^1$ or a furyl group which may be substituted with $W^1$; and $W^1$ represents an alkyl group having 1 to 10 carbon atom(s), a haloalkyl group having 1 to 10 carbon atom(s), an alkoxy group having 1 to 10 carbon atom(s), a hydroxy group, a halogen atom, a nitro group, a formyl group, a cyano group, a carboxyl group, a phosphonyl group or a sulfonyl group).

According to a 38th aspect, in the polyhydroxyamide resin according to any one of the 31st aspect to the 37th aspect, the Y represents an organic group containing a benzene ring substituted with at least one OH group.

According to a 39th aspect, in the polyhydroxyamide resin according to the 38th aspect, the Y represents an organic group containing two or more benzene rings substituted with at least one OH group.

According to a 40th aspect, in the polyhydroxyamide resin according to the 39th aspect, the Y has a structure represented by Formula (13):

[Chemical Formula 13]

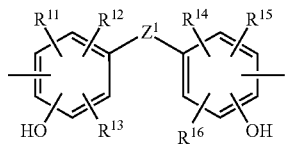

(13)

(where $R^{11}$ to $R^{16}$ independently represent a hydrogen atom, an alkyl group having 1 to 10 carbon atom(s), a haloalkyl group having 1 to 10 carbon atom(s), an alkoxy group having 1 to 10 carbon atom(s), a hydroxy group, a halogen atom, a nitro group, a formyl group, a cyano group, a carboxyl group, a phosphonyl group, a sulfonyl group, a phenyl group which may be substituted with $W^2$, a naphthyl group which may be substituted with $W^2$, a thienyl group which may be substituted with $W^2$ or a furyl group which may be substituted with $W^2$; $W^2$ represents an alkyl group having 1 to 10 carbon atom(s), a haloalkyl group having 1 to 10 carbon atom(s), an alkoxy group having 1 to 10 carbon atom(s), a hydroxy group, a halogen atom, a nitro group, a formyl group, a cyano group, a carboxyl group, a phosphonyl group or a sulfonyl group; $Z^1$ represents a single bond, an alkylene group having 1 to 10 carbon atom(s) which may be substituted with $W^3$, $—C(O)O—$, $—C(O)NH—$, $—O—$, $—S—$, $—S(O)_2—$ or $—C(O)—$; and $W^3$ represents an alkyl group having 1 to 10 carbon atom(s), a haloalkyl group having 1 to 10 carbon atom(s) or an alkoxy group having 1 to 10 carbon atom(s)).

According to a 41st aspect, in the polyhydroxyamide resin according to the 40th aspect, the $Z^1$ represents a single bond, $—CH_2—$, $—C(CH_3)_2—$, $—C(CF_3)_2—$, $—C(O)NH—$, $—O—$, $—S(O)_2—$ or $—C(O)—$.

According to a 42nd aspect, in the polyhydroxyamide resin according to any one of the 31st aspect to the 41st aspect, the polyhydroxyamide resin (A) further contains at least one type of a repeating unit represented by Formula (14):

[Chemical Formula 14]

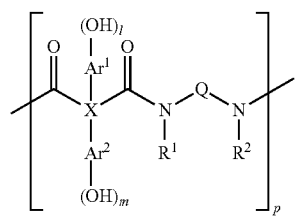

(14)

(where X, $Ar^1$, $Ar^2$, $R^1$, $R^2$, l and m represent the same meaning as defined above; and represents -valent aliphatic group or an aromatic group; Q represents a divalent organic group (with a proviso that the group contains no OH group); and p represents an integer of 1 or more).

According to a 43rd aspect, in the polyhydroxyamide resin according to the 42nd aspect, the Q represents an organic group containing an aromatic group.

According to a 44th aspect, in the polyhydroxyamide resin according to the 43rd aspect, the Q represents an organic group containing a benzene ring.

According to a 45th aspect, in the polyhydroxyamide resin according to the 44th aspect, the Q represents an organic group containing two or more benzene rings.

According to a 46th aspect, in the polyhydroxyamide resin according to the 45th aspect, the Q represents an organic group containing at least one repeating unit structure selected from Formula (15) to Formula (17):

[Chemical Formula 15]

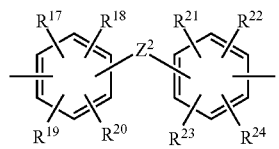

(15)

-continued

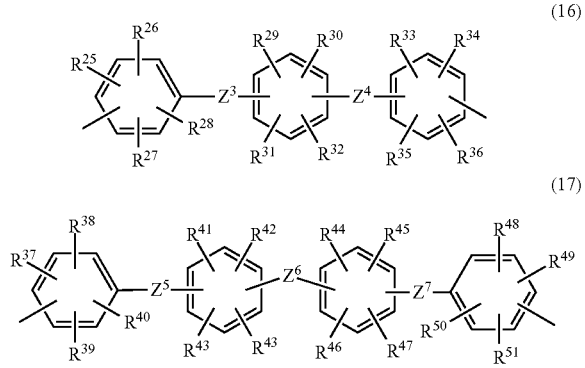

(in Formula (15), $R^{17}$ to $R^{24}$ independently represent a hydrogen atom, an alkyl group having 1 to 10 carbon atom(s), a haloalkyl group having 1 to 10 carbon atom(s), an alkoxy group having 1 to 10 carbon atom(s), a halogen atom, a nitro group, a formyl group, a cyano group, a carboxyl group, a phosphonyl group, a sulfonyl group, a phenyl group which may be substituted with $W^4$, a naphthyl group which may be substituted with $W^4$, a thienyl group which may be substituted with $W^4$ or a furyl group which may be substituted with $W^4$; and $W^4$ represents an alkyl group having 1 to 10 carbon atom(s), a haloalkyl group having 1 to 10 carbon atom(s), an alkoxy group having 1 to 10 carbon atom(s), a hydroxy group, a halogen atom, a nitro group, a formyl group, a cyano group, a carboxyl group, a phosphonyl group or a sulfonyl group, in Formula (16) and Formula (17), $R^{25}$ to $R^{51}$ independently represent a hydrogen atom, an alkyl group having 1 to 10 carbon atom(s), a haloalkyl group having 1 to 10 carbon atom(s), an alkoxy group having 1 to 10 carbon atom(s), a halogen atom, a nitro group, a formyl group, a cyano group, a carboxyl group, a phosphonyl group, a sulfonyl group, a phenyl group which may be substituted with $W^4$, a naphthyl group which may be substituted with $W^4$, a thienyl group which may be substituted with $W^4$ or a furyl group which may be substituted with $W^4$; and $W^4$ represents the same meaning as defined above, and in Formula (15) to Formula (17), $Z^2$ to $Z^7$ independently represent a single bond, an alkylene group having 1 to 10 carbon atom(s) which may be substituted with $W^5$, —C(O)O—, —C(O)NH—, —O—, —S—, —S(O)$_2$— or —C(O)—; and $W^5$ represents an alkyl group having 1 to 10 carbon atom(s), a haloalkyl group having 1 to 10 carbon atom(s) or an alkoxy group having 1 to 10 carbon atom(s)).

According to a 47th aspect, in the polyhydroxyamide resin according to the 46th aspect, in Formula (15) to Formula (17), $Z^2$ to $Z^7$ independently represent an alkylene group having 1 to 3 carbon atom(s), —O—, —S—, —S(O)$_2$— or —C(O)—.

According to a 48th aspect, in the polyhydroxyamide resin according to the 47th aspect, in Formula (15), $Z^2$ represents —O—, According to a 49th aspect, in the polyhydroxyamide resin according to the 47th aspect, in Formula (16), $Z^3$ and $Z^4$ represent —O—.

According to a 50th aspect, in the polyhydroxyamide resin according to the 47th aspect, in Formula (17), $Z^5$ and $Z^7$ represent —O— and $Z^6$ represents —S(O)$_2$—.

According to a 51st aspect, in the polyhydroxyamide resin according to any one of the 31st aspect to the 50th aspect, the polyhydroxyamide resin (A) further contains at least one type of a repeating unit represented by Formula (18):

[Chemical Formula 16]

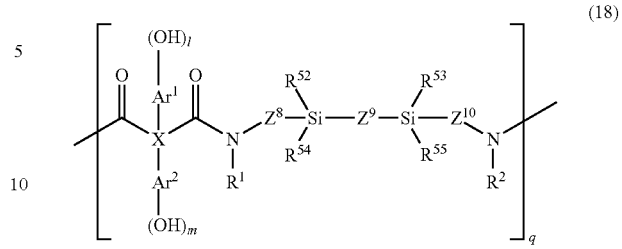

(where X, $Ar^1$, $Ar^2$, $R^1$, $R^2$, l and m represent the same meaning as defined above; $R^{52}$ to $R^{56}$ independently represent a hydrogen atom, an alkyl group having 1 to 10 carbon atom(s), a haloalkyl group having 1 to 10 carbon atom(s), an alkoxy group having 1 to 10 carbon atom(s), a halogen atom, a nitro group, a formyl group, a cyano group, a carboxyl group, a phosphonyl group, a sulfonyl group, a phenyl group which may be substituted with $W^6$, a naphthyl group which may be substituted with $W^6$, a thienyl group which may be substituted with $W^6$ or a furyl group which may be substituted with $W^6$; $W^6$ represents an alkyl group having 1 to 10 carbon atom(s), a haloalkyl group having 1 to 10 carbon atom(s), an alkoxy group having 1 to 10 carbon atom(s), a hydroxy group, a halogen atom, a nitro group, a formyl group, a cyano group, a carboxyl group, a phosphonyl group or a sulfonyl group; $Z^8$ to $Z^{10}$ independently represent a single bond, an alkylene group having 1 to 10 carbon atom(s) which may be substituted with $W^7$, —C(O)O—, —C(O)NH—, —O—, —S—, —S(O)$_2$— or —C(O)—; $W^7$ represents an alkyl group having 1 to 10 carbon atom(s), a haloalkyl group having 1 to 10 carbon atom(s) or an alkoxy group having 1 to 10 carbon atom(s); and q represents an integer of 1 or more).

According to a 52nd aspect, in the polyhydroxyamide resin according to the 51st aspect, in Formula (18), $Z^8$ to $Z^{10}$ independently represent an alkylene group having 1 to 3 carbon atom(s), —O—, —S—, —S(O)$_2$— or —C(O)—.

According to a 53rd aspect, in the polyhydroxyamide resin according to the 52nd aspect, in Formula (18), $Z^8$ and $Z^{10}$ represent a propylene group and $Z^9$ represents —O—.

Effects of the Invention

The positive photosensitive resin composition of the present invention can produce a cured film excellent in electric insulating properties, heat resistance, mechanical strength and electrical characteristics.

Furthermore, a high-resolution circuit pattern can be formed by exposing the positive photosensitive resin composition of the present invention applied on a substrate to light using a specified pattern mask and then by developing the resultant pattern with an alkaline developer.

A cured film produced using the positive photosensitive resin composition of the present invention is useful as a protecting film and an insulating film for a semiconductor and a circuit board such as a printed board, and is particularly suitable for a protecting film and an insulating film for a semiconductor.

In addition, the positive photosensitive resin of the present invention can be simply and easily synthesized and contains no chloride, low molecule compound or the like affecting adversely a semiconductor element, an electronic/electric circuit or the like, so that the resin can be used as the positive photosensitive resin composition of the present invention without purifying the resin.

BEST MODES FOR CARRYING OUT THE INVENTION

Hereinafter, the present invention will be described more in detail.

The positive photosensitive resin composition according to the present invention contains at least one type of a polyhydroxyamide resin (A) containing a repeating unit represented by Formula (1) and having a weight average molecular weight of 3,000 to 100,000, and a compound (B) generating an acid by light irradiation.

In addition, the polyhydroxyamide resin (A) is also in the scope of the present invention.

(Polyhydroxyamide Resin (A))

The polyhydroxyamide resin (A) used in the present invention contains the repeating unit represented by Formula (1):

[Chemical Formula 17]

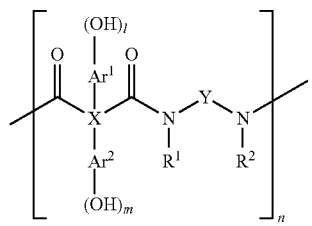
(1)

(where X represents a tetravalent aliphatic group or an aromatic group; $R^1$ and $R^2$ independently represent a hydrogen atom or an alkyl group having 1 to 10 carbon atom(s); $Ar^1$ and $Ar^2$ independently represent an aromatic group; Y represents an organic group containing an aromatic group substituted with at least one OH group; n represents an integer of 1 or more; and l and m independently represent an integer of 0 or 1 or more and satisfy $1+m \leq 2$).

In Formula (1), X is preferably an aliphatic group, more preferably an aliphatic group having a cyclic structure in particular.

In addition, it is preferred that in the X, an $X-Ar^1$ bond and an $X-C(O)$ bond be each individually bonded to an adjacent atom in the X, and an $X-Ar^2$ bond and another $X-C(O)$ bond be each bonded to an adjacent atom in the X.

Specific examples of a group:

[Chemical Formula 18]

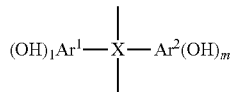

containing the X include groups having a structure represented by Formula (2):

[Chemical Formula 19]

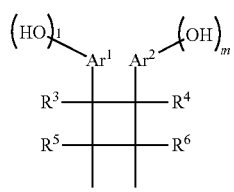
(2)

(where $Ar^1$, $Ar^2$, Y, l and m represent the same meaning as defined above; and $R^3$ to $R^6$ independently represent a hydrogen atom or an alkyl group having 1 to 10 carbon atom(s)).

It is preferred that in Formula (1), $Ar^1$ and $Ar^2$ independently represent a benzene ring and specific examples of the $-Ar^1(OH)_l$ group containing $Ar^1$ and the $-Ar^2(OH)_m$ group containing $Ar^2$ include groups having a structure represented by Formula (3):

[Chemical Formula 20]

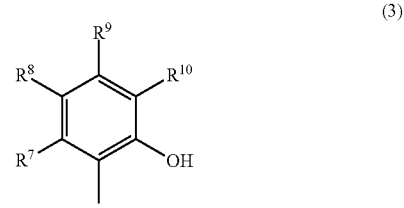
(3)

(where $R^7$ to $R^{10}$ independently represent a hydrogen atom, an alkyl group having 1 to 10 carbon atom(s), a haloalkyl group having 1 to 10 carbon atom(s), an alkoxy group having 1 to 10 carbon atom(s), a halogen atom, a nitro group, a formyl group, a cyano group, a carboxyl group, a phosphonyl group, a sulfonyl group, a phenyl group which may be substituted with $W^1$, a naphthyl group which may be substituted with $W^1$, a thienyl group which may be substituted with $W^1$ or a furyl group which may be substituted with $W^1$; and $W^1$ represents an alkyl group having 1 to 10 carbon atom(s), a haloalkyl group having 1 to 10 carbon atom(s), an alkoxy group having 1 to 10 carbon atom(s), a hydroxy group, a halogen atom, a nitro group, a formyl group, a cyano group, a carboxyl group, a phosphonyl group or a sulfonyl group).

In Formula (1), it is preferred that Y be an organic group containing a benzene ring substituted with at least one OH group and it is more preferred that Y be particularly an organic group containing two or more benzene rings substituted with at least one OH group.

Examples of the Y include groups having a structure represented by Formula (4):

[Chemical Formula 21]

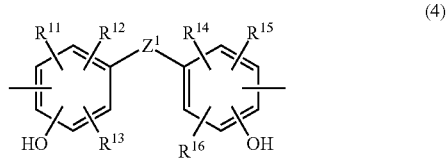
(4)

(where $R^{11}$ to $R^{16}$ independently represent a hydrogen atom, an alkyl group having 1 to 10 carbon atom(s), a haloalkyl group having 1 to 10 carbon atom(s), an alkoxy group having 1 to 10 carbon atom(s), a hydroxy group, a halogen atom, a nitro group, a formyl group, a cyano group, a carboxyl group, a phosphonyl group, a sulfonyl group, a phenyl group which may be substituted with $W^2$, a naphthyl group which may be substituted with $W^2$, a thienyl group which may be substituted with $W^2$ or a furyl group which may be substituted with $W^2$; $W^2$ represents an alkyl group having 1 to 10 carbon atom(s), a haloalkyl group having 1 to 10 carbon atom(s), an alkoxy group having 1 to 10 carbon atom(s), a hydroxy group, a halogen atom, a nitro group, a formyl group, a cyano group, a carboxyl group, a phosphonyl group or a sulfonyl group; $Z^1$ represents a single bond, an alkylene group having 1 to 10 carbon atom(s) which may be substituted with $W^3$, —C(O)O—, —C(O)NH—, —O—, —S—, —S(O)$_2$— or —C(O)—; and $W^3$ represents an alkyl group having 1 to 10 carbon atom(s), a haloalkyl group having 1 to 10 carbon atom(s) or an alkoxy group having 1 to 10 carbon atom(s)).

It is desired that in Formula (4), the Z is a single bond, —CH$_2$—, —C(CH$_3$)$_2$—, —C(CF$_3$)$_2$—, —C(O)NH—, —O—, —S(O)$_2$— or —C(O)—.

Specific examples of the compound having a structure represented by Formula (4) include 4,4'-dihydroxybenzidine (3BP), 3,3'-diamino-4,4'-dihydroxybiphenyl (4BP), 3,3'-diamino-2,2'-dihydroxybiphenyl (2BP), 2,2'-bis(3-amino-4-hydroxyphenyl) hexafluoropropane (BAHF), 2,2-bis(4-amino-3,5-dihydroxyphenyl) hexafluoropropane, 2,2-bis(4-(3-amino-4-hydroxyphenoxy) phenyl) hexafluoropropane, bis(3-amino-4-hydroxyphenyl) methane (BAPF), 3,3'-diamino-4,4'-dihydroxybenzophenone (AHPK), 3,3'-diamino-4,4'-dihydroxy-phenyl ether (AHPE), 3,3'-diamino-4,4'-dihydroxy-thiophenyl ether, 2,2'-bis(3-amino-4-hydroxyphenyl) propane (BAPA), (3-amino-4-hydroxy) phenyl (3-amino-4-hydroxy) anilide (AHPA), bis(3-amino-4-hydroxyphenyl) sulfone (BSDA), (4-(4-aminophenoxy) phenyl) sulfone, 2,4-diaminophenol, 3,5-diaminophenol, 2,5-diaminophenol, 4,6-diaminoresorcinol, 2,5-diaminohydroquinone, bis(3-amino-4-hydroxyphenyl) thioether, bis(4-amino-3,5-dihydroxyphenyl) thioether, bis(3-amino-4-hydroxyphenyl) ether, bis(4-amino-3,5-dihydroxyphenyl) ether, bis(3-amino-4-hydroxyphenyl) methane, bis(4-amino-3,5-dihydroxyphenyl) methane, bis(3-amino-4-hydroxyphenyl) sulfone, bis(4-amino-3,5-dihydroxyphenyl) sulfone, 4,4'-diamino-3,3'-dihydroxybiphenyl, 4,4'-diamino-3,3'-dihydroxy-5,5'-dimethylbiphenyl, 4,4'-diamino-3,3'-dihydroxy-5,5'-dimethoxybiphenyl, 1,4-bis(3-amino-4-hydroxyphenoxy) benzene, 1,3-bis(3-amino-4-hydroxyphenoxy) benzene, 1,4-bis(4-amino-3-hydroxyphenoxy) benzene, 1,3-bis(4-amino-3-hydroxyphenoxy) benzene, bis(4-(3-amino-4-hydroxyphenoxy) phenyl) sulfone, bis(4-(3-amino-4-hydroxyphenoxy) phenyl) propane or 1,4-bis(4-aminophenoxy) benzene. However, the present invention is not limited to these examples.

In addition, the polyhydroxyamide resin of the present invention may contain, besides the repeating unit represented by Formula (1), a repeating unit represented by Formula (5):

[Chemical Formula 22]

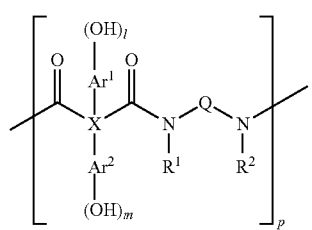

(5)

(where X, Ar$^1$, Ar$^2$, R$^1$, R$^2$, l and m represent the same meaning as defined above; Q represents a divalent organic group (with a proviso that the group contains no OH group); and p represents an integer of 1 or more).

In Formula (5), it is desired that Q is an aromatic group, particularly an organic group containing a benzene ring, preferably an organic group containing two or more benzene rings.

Examples of the Q include groups having structures represented by Formula (6) to Formula (8):

[Chemical Formula 23]

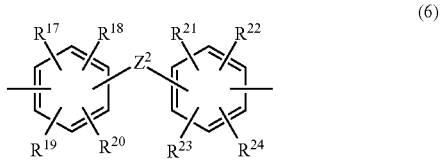

(6)

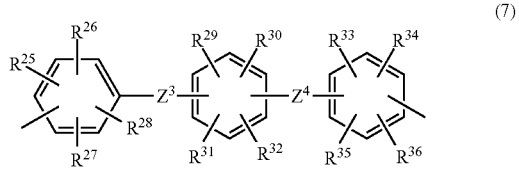

(7)

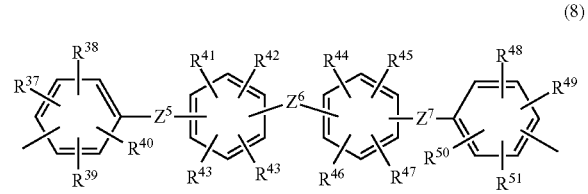

(8)

(in Formula (6), R$^{17}$ to R$^{24}$ independently represent a hydrogen atom, an alkyl group having 1 to 10 carbon atom(s), a haloalkyl group having 1 to 10 carbon atom(s), an alkoxy group having 1 to 10 carbon atom(s), a halogen atom, a nitro group, a formyl group, a cyano group, a carboxyl group, a phosphonyl group, a sulfonyl group, a phenyl group which may be substituted with W$^4$, a naphthyl group which may be substituted with W$^4$, a thienyl group which may be substituted with W$^4$ or a furyl group which may be substituted with W$^4$; and W$^4$ represents an alkyl group having 1 to 10 carbon atom(s), a haloalkyl group having 1 to 10 carbon atom(s), an alkoxy group having 1 to 10 carbon atom(s), a hydroxy group, a halogen atom, a nitro group, a formyl group, a cyano group, a carboxyl group, a phosphonyl group or a sulfonyl group, in Formula (7) and Formula (8), R$^{25}$ to R$^{51}$ independently represent a hydrogen atom, an alkyl group having 1 to 10 carbon atom(s), a haloalkyl group having 1 to 10 carbon atom(s), an alkoxy group having 1 to 10 carbon atom(s), a halogen atom, a nitro group, a formyl group, a cyano group, a carboxyl group, a phosphonyl group, a sulfonyl group, a phenyl group which may be substituted with W$^4$, a naphthyl group which may be substituted with W$^4$, a thienyl group which may be substituted with W$^4$ or a furyl group which may be substituted with W$^4$; and W$^4$ represents the same meaning as defined above, and in Formula (6) to Formula (8), Z$^2$ to Z$^7$ independently represent a single bond, an alkylene group having 1 to 10 carbon atom(s) which may be substituted with W$^5$, —C(O)O—, —C(O)NH—, —O—, —S—, —S(O)$_2$— or —C(O)—; and W$^5$ represents an alkyl group having 1 to 10 carbon atom(s), a haloalkyl group having 1 to 10 carbon atom(s) or an alkoxy group having 1 to 10 carbon atom(s)).

It is preferred that in Formula (6) to Formula (8), Z$^2$ to Z$^7$ independently represent an alkylene group having 1 to 3 carbon atom(s), —O—, —S—, —S(O)$_2$— or —C(O)—.

Particularly, it is preferred that $Z^2$ to $Z^5$ or $Z^7$ represent —O— and $Z^6$ represents —S(O)$_2$—.

Specific examples of the compound having structures represented by Formula (6) to Formula (8) include: aromatic diamines such as 2,2'-bis(trifluoromethyl) benzidine, 3,3'-bis(trifluoromethyl) benzidine, 2,6,2',6'-tetraxis(trifluoromethyl) benzidine, 2,2-bis(4-anilino) hexafluoropropane, 2,2-bis(3-anilino) hexafluoropropane, 2-bis(3-amino-4-toluyl) 2,2-bis(4-(4-amino-3-carboxyphenoxy) phenyl) hexafluoropropane, p-phenylenediamine, m-phenylenediamine, 2,4,6-trimethyl-1,3-phenylenediamine, 2,3,5,6-tetramethyl-1,4-phenylenediamine, 4,4'-diamino diphenyl ether, 3,4'-diamino diphenyl ether, 3,3'-diamino diphenyl ether, 4,4'-diamino diphenyl sulfone, 4,4'-diamino diphenyl methane, 3,4'-diamino diphenyl methane, 3,3'-diamino diphenyl methane, 4,4-methylene-bis(2-methylaniline), 4,4'-methylene-bis(2,6-dimethylaniline), 4,4-methylene-bis(2,6-diethylaniline), 4,4'-methylene-bis(2-isopropyl-6-methylaniline), 4,4'-methylene-bis(2,6-diisopropylaniline), 4,4'-diamino diphenyl sulfone, 3,3'-diamino diphenyl sulfone, benzidine, o-tolidine, m-tolidine, and 3,3',5,5'-tetramethylbenzidine; diamines having acidic groups such as 1,3-bis(4-aminophenoxy) benzene, 2,4-diamino benzoic acid, 2,5-diamino benzoic acid, 3,5-diamino benzoic acid, 4,6-diamino-1,3-benzene dicarboxylic acid, 2,5-diamino-1,4-benzene dicarboxylic acid, bis(4-amino-3-carboxyphenyl) ether, bis(4-amino-3,5-dicarboxyphenyl) ether, bis(4-amino-3-carboxyphenyl) sulfone, bis(4-amino-3,5-dicarboxyphenyl) sulfone, 4,4'-diamino-3,3'-dicarboxybiphenyl, 4,4'-diamino-3,3'-dicarboxy-5,5'-dimethylbiphenyl, 4,4'-diamino-3,3'-dicarboxy-5,5'-dimethoxybiphenyl, 1,4-bis(4-amino-3-carboxyphenoxy) benzene, 1,3-bis(4-amino-3-carboxyphenoxy) benzene, bis(4-(4-amino-3-carboxyphenoxy) phenyl) sulfone, and bis(4-(4-amino-3-carboxyphenoxy) phenyl); and aliphatic diamines such as 1,6-hexanediamine, 1,4-cyclohexanediamine, 1,3-cyclohexanediamine, 1,4-bis(aminomethyl) cyclohexane, 1,3-bis (aminomethyl) cyclohexane, 4,4'-diaminodicyclohexylmethane and 4,4'-diamino-3-3'-dimethyldicyclohexylmethane. However, the present invention is not limited to these examples.

Furthermore, the polyhydroxyamide resin of the present invention may contain, besides the repeating unit represented by Formula (1), a repeating unit represented by Formula (9):

[Chemical Formula 24]

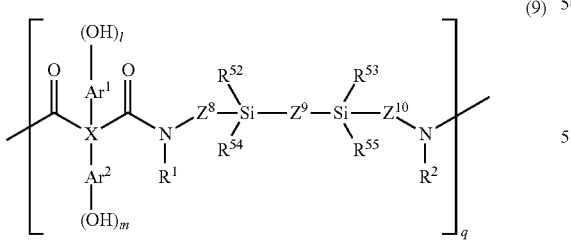

(9)

(where X, Ar$^1$, Ar$^2$, R$^1$, R$^2$, l and m represent the same meaning as defined above; R$^{52}$ to R$^{56}$ independently represent a hydrogen atom, an alkyl group having 1 to 10 carbon atom(s), a haloalkyl group having 1 to 10 carbon atom(s), an alkoxy group having 1 to 10 carbon atom(s), a halogen atom, a nitro group, a formyl group, a cyano group, a carboxyl group, a phosphonyl group, a sulfonyl group, a phenyl group which may be substituted with W$^6$, a naphthyl group which may be substituted with W$^6$, a thienyl group which may be substituted with W$^6$ or a furyl group which may be substituted with W$^6$; W$^6$ represents an alkyl group having 1 to 10 carbon atom(s), a haloalkyl group having 1 to 10 carbon atom(s), an alkoxy group having 1 to 10 carbon atom(s), a hydroxy group, a halogen atom, a nitro group, a formyl group, a cyano group, a carboxyl group, a phosphonyl group or a sulfonyl group; $Z^8$ to $Z^{10}$ independently represent a single bond, an alkylene group having 1 to 10 carbon atom(s) which may be substituted with W$^7$, —C(O)O—, —C(O)NH—, —O—, —S—, —S(O)$_2$— or —C(O)—; W$^7$ represents an alkyl group having 1 to 10 carbon atom(s), a haloalkyl group having 1 to 10 carbon atom(s) or an alkoxy group having 1 to 10 carbon atom(s); and q represents an integer of 1 or more).

It is preferred that in Formula (9), $Z^8$ to $Z^{10}$ independently represent an alkylene group having 1 to 3 carbon atom(s), —O—, —S—, —S(O)$_2$— or —C(O)—. Particularly, it is more preferred that $Z^8$ and $Z^{10}$ represent a propylene group and $Z^9$ represents —O—.

The polyhydroxyamide resin represented by Formula (1) to be used in the present invention can be obtained, for example, by reacting a coumarin dimer component with a diamine component.

(Coumarin Dimer Component)

The coumarin dimer component which is a monomer component constituting the polyhydroxyamide resin (A) used in the present invention is represented by General Formula (19):

[Chemical Formula 25]

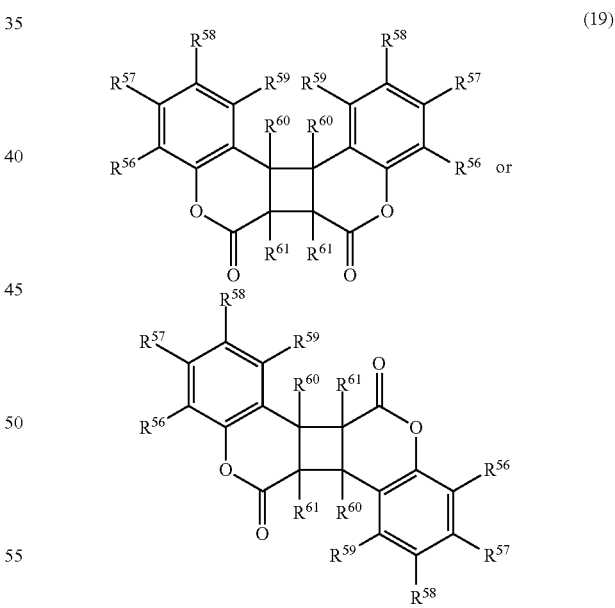

(19)

(where R$^{56}$, R$^{57}$, R$^{58}$, R$^{59}$, R$^{60}$ and R$^{61}$ independently represent an alkyl group having 1 to 10 carbon atom(s), a halogen atom, a nitro group, an amino group, a cyano group, a carboxy group, an alkoxycarbonyl group having 1 to 10 carbon atom(s), a halogenated alkyl group having 1 to 10 carbon atom(s) or a hydroxy group).

(Diamine Component)

The diamine component which is a monomer component constituting the polyhydroxyamide resin (A) used in the present invention is not particularly limited so long as it is a diamine containing aromatic groups substituted with at least one OH group.

Examples of the diamine component include 4,4'-dihydroxybenzidine (3BP), 3,3'-diamino-4,4'-dihydroxybiphenyl (4BP), 3,3'-diamino-2,2'-dihydroxybiphenyl (2BP), 2,2'-bis(3-amino-4-hydroxyphenyl) hexafluoropropane (BAHF), 2,2-bis(4-amino-3,5-dihydroxyphenyl) hexafluoropropane, 2,2-bis(4-(3-amino-4-hydroxyphenoxy) phenyl) hexafluoropropane, bis(3-amino-4-hydroxyphenyl) methane (BAPF), 3,3'-diamino-4,4'-dihydroxybenzophenone (AHPK), 3,3'-diamino-4,4'-dihydroxy-phenyl ether (AHPE), 3,3'-diamino-4,4'-dihydroxy-thiophenyl ether, 2,2'-bis(3-amino-4-hydroxyphenyl) propane (BAPA), (3-amino-4-hydroxy) phenyl (3-amino-4-hydroxy) anilide (AHPA), bis(3-amino-4-hydroxyphenyl) sulfone (BSDA), (4-(4-aminophenoxy) phenyl) sulfone, 2,4-diaminophenol, 3,5-diaminophenol, 2,5-diaminophenol, 4,6-diaminoresorcinol, 2,5-diaminohydroquinone, bis(3-amino-4-hydroxyphenyl) thioether, bis(4-amino-3,5-dihydroxyphenyl) thioether, bis(3-amino-4-hydroxyphenyl) ether, bis(4-amino-3,5-dihydroxyphenyl) ether, bis(3-amino-4-hydroxyphenyl) methane, bis(4-amino-3,5-dihydroxyphenyl) methane, bis(3-amino-4-hydroxyphenyl) sulfone, bis(4-amino-3,5-dihydroxyphenyl) sulfone, 4,4'-diamino-3,3'-dihydroxybiphenyl, 4,4'-diamino-3,3'-dihydroxy-5,5'-dimethylbiphenyl, 4,4'-diamino-3,3'-dihydroxy-5,5'-dimethoxybiphenyl, 1,4-bis(3-amino-4-hydroxyphenoxy) benzene, 1,3-bis(3-amino-4-hydroxyphenoxy) benzene, 1,4-bis(4-amino-3-hydroxyphenoxy) benzene, 1,3-bis(4-amino-3-hydroxyphenoxy) benzene, bis(4-(3-amino-4-hydroxyphenoxy) phenyl) sulfone, bis(4-(3-amino-4-hydroxyphenoxy) phenyl) propane or 1,4-bis(4-aminophenoxy) benzene. However, the present invention is not limited to these examples.

Among the above diamine components, particularly preferred examples thereof include bis(3-amino-4-hydroxyphenyl) methane (BAPF), 2,2'-bis(3-amino-4-hydroxyphenyl) propane (BAPA), 2,2'-bis(3-amino-4-hydroxyphenyl) hexafluoropropane (BAHF), 3,3'-diamino-4,4'-dihydroxyphenyl ether (AHPE), 3,3'-diamino-4,4'-dihydroxybenzophenone (AHPK), bis(3-amino-4-hydroxyphenyl) sulfide (BSDA) and (3-amino-4-hydroxy) phenyl (3-amino-4-hydroxy) anilide (AHPA).

In addition, as the diamine component which is a monomer component constituting the polyhydroxyamide resin (A) used in the present invention, besides the above diamines containing aromatic groups substituted with at least one OH group, other diamines can be used.

The other diamines are not particularly limited, however, it is desired that the other diamines are preferably diamines containing aromatic groups, particularly diamines containing one or more benzene ring(s).

Examples of the other diamines which are diamines containing aromatic groups include p-phenylenediamine, m-phenylenediamine, 2,4,6-trimethyl-1,3-phenylenediamine, 2,3,5,6-tetramethyl-1,4-phenylenediamine, 4,4'-diaminodiphenylether, 3,4'-diaminodiphenylether, 3,3'-diaminodiphenylether, 4,4'-diaminodiphenylsulfide, 4,4'-diaminodiphenylmethane, 3,4'-diaminodiphenylmethane, 3,3'-diaminodiphenylmethane, 4,4-methylene-bis(2-methylaniline), 4,4'-methylene-bis(2,6-dimethylaniline), 4,4-methylene-bis(2,6-diethylaniline), 4,4'-methylene-bis(2-isopropyl-6-methylaniline), 4,4'-methylene-bis(2,6-diisopropylaniline), 4,4'-diaminodiphenylsulfone, 3,3'-diaminodiphenylsulfone, benzidine, o-tolidine, m-tolidine, 3,3',5,5'-tetramethylbenzidine, 1,4-bis(4-aminophenoxy) benzene, 1,3-bis(4-aminophenoxy) benzene, 1,3-bis(3-aminophenoxy) benzene, bis(4-(4-aminophenoxy) phenyl) sulfone, bis(4-(3-aminophenoxy) phenyl) sulfone, 2,2-bis(4-(4-aminophenoxy) phenyl) propane or 2,2-bis(4-(3-aminophenoxy) phenyl) propane.

Among them, particularly preferred examples include 4,4'-diaminodiphenylether (ODA) and 1,3-bis(4-aminophenoxy) benzene (DA4P).

Furthermore, as the diamine component which is a monomer component constituting the polyhydroxyamide resin (A) used in the present invention, besides the above diamines containing aromatic groups substituted with at least one OH group, also diamines containing siloxane may be used. By using a siloxane-containing diamine in a combination, the adhesion of a coating film containing the polyhydroxyamide resin (A) to a substrate can be enhanced.

As a preferred example of the siloxane-containing diamine, siloxane-containing diamines represented by Formula (20):

[Chemical Formula 26]

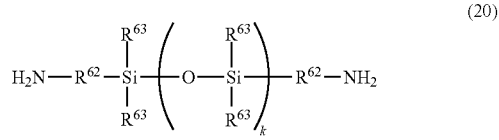

(20)

(where $R^{62}$ represents a divalent organic group; $R^{63}$ independently represent a monovalent organic group; and k represents an integer of 1 or more) are preferred and among them, bis(3-aminopropyl)-1,1,3,3-tetramethyldisiloxane (APDS) is more preferred.

The polyhydroxyamide resin (A) used in the present invention is obtained by reacting the coumarin dimer component and the diamine component, that is a diamine containing aromatic groups substituted with at least one OH group and further as desired other diamine components and/or siloxane-containing diamines, and is usually obtained by effecting the reaction in a polar solvent such as N-methylpyrrolidone, dimethylacetoamide, γ-butylolactone and diglyme. The solvent used therefor is not particularly limited so long as the solvent is a solvent capable of dissolving the polyhydroxyamide resin (A). In addition, the lower limit of the temperature range for the reaction of the coumarin dimer component and the diamine component is usually −20° C. or more, preferably −5° C. or more and the upper limit of the temperature range is usually 150° C. or less, preferably 100° C. or less. From the range between the lower limit and the upper limit, any temperature can be selected.

(Compound (B) Generating Acid by Light Irradiation)

The compound (B) generating an acid by light irradiation which is used in the present invention is not particularly limited so long as the compound generates an acid through a photoreaction and enhances the solubility of the light-irradiated part in an alkaline developer. These compounds may be used singly or in combination of two or more types thereof.

As the compound (B), any of conventionally known photoacid generators may be adopted. Specific examples thereof include o-quinonediazide compounds, allyl diazonium salts, diallyl iodonium salts, triallyl sulfonium salts, o-nitrobenzyl esters, p-nitrobenzyl esters, trihalomethyl group-substituted s-triazine derivatives and imidesulfonate derivatives.

In addition, if necessary, a sensitizer can be used in combination with the compound (B) generating an acid by light irradiation. Examples of such a sensitizer include perylene, anthracene, thioxanthone, Michler's ketone, benzophenone and fluorene. However, the present invention is not limited to these examples.

Among the compounds (B) generating an acid by light irradiation, o-quinonediazide compounds are preferred in terms of capable of obtaining high sensitivity and high-resolution with respect to the coating film obtained using the positive photosensitive resin composition.

An o-quinonediazide compound is usually obtained by subjecting o-quinonediazidesulfonyl chloride and a compound having at least any one group selected from a hydroxy group and an amino group to a condensation reaction in the presence of a basic catalyst, as an o-quinonediazidesulfonate ester or an o-quinonediazidesulfonamide.

Examples of an o-quinonediazidesulfonic acid component constituting the o-quinonediazidesulfonyl chloride include 1,2-naphthoquinone-2-diazide-4-sulfonic acid, 1,2-naphthoquinone-2-diazide-5-sulfonic acid and 1,2-naphthoquinone-2-diazide-6-sulfonic acid.

Examples of the compound having a hydroxy group include: phenol compounds such as phenol, o-cresol, m-cresol, p-cresol, hydroquinone, resorcinol, catechol, o-methoxyphenol, 4,4-isopropylidenediphenol, 1,1-bis(4-hydroxyphenyl) cyclohexane, 4,4'-dihydroxyphenylsulfone, 4,4-hexafluoroisopropylidenediphenol, 4,4',4''-trihydroxytriphenylmethane, 1,1,1-tris(4-hydroxyphenyl) ethane, 4,4'-(1-(4-(1-(4-hydroxyphenyl)-1-methylethyl) phenyl) ethylidene) bisphenol, methyl 3,4,5-trihydroxybenzoate, propyl 3,4,5-trihydroxybenzoate, isoamyl 3,4,5-trihydroxybenzoate ester, 2-ethylbutyl 3,4,5-trihydroxybenzoate ester, 2,4-dihydroxybenzophenone, 2,3,4-trihydroxybenzophenone, 2,2',4,4'-tetrahydroxybenzophenone, 2,3,4,4'-tetrahydroxybenzophenone, and 2,3,4,2',4'-pentahydroxybenzophenone; aliphatic alcohols such as ethanol, 2-propanol, 4-butanol, cyclohexanol, ethylene glycol, propylene glycol, diethylene glycol, dipropylene glycol, 2-methoxyethanol, 2-butoxyethanol, 2-methoxypropanol, 2-butoxypropanol, ethyl lactate and butyl lactate; anilines such as aniline, o-toluidine, m-toluidine, p-toluidine, 4-aminodiphenylmethane, 4-aminodiphenyl, o-phenylenediamine, m-phenylenediamine, p-phenylenediamine, 4,4'-diaminodiphenylmethane and 4,4'-diaminodiphenylether; and aminocyclohexane.

Furthermore, examples of the compound having both of a hydroxy group and an amino group include: aminophenols such as o-aminophenol, m-aminophenol, p-aminophenol, 4-aminoresorcinol, 2,3-diaminophenol, 2,4-diaminophenol, 4,4'-diamino-4''-hydroxytriphenylmethane, 4-amino-4',4''-dihydroxytriphenylmethane, bis(4-amino-3-carboxy-5-hydroxyphenyl) ether, bis(4-amino-3-carboxy-5-hydroxyphenyl) methane, bis(4-amino-3-carboxy-5-hydroxyphenyl) sulfone, 2,2-bis(4-amino-3-carboxy-5-hydroxyphenyl) propane and 2,2-bis(4-amino-3-carboxy-5-hydroxyphenyl) hexafluoropropane; and alkanolamines such as 2-aminoethanol, 3-aminopropanol and 4-aminocyclohexanol.

By subjecting o-quinonediazidesulfonyl chloride and a compound having at least one group selected from a hydroxy group and an amino group to a condensation reaction, there is obtained a di-substituted, tri-substituted, tetra-substituted or penta-substituted o-quinonediazide compound in which a part or the whole of hydroxy groups or amino groups of the above compound is replaced by an o-quinonediazidesulfonyl group of o-quinonediazidesulfonyl chloride. When such an o-quinonediazide compound is used as a component of the positive photosensitive resin composition, generally used is the above poly-substituted o-quinonediazide compound singly or as a mixture of two or more types of poly-substituted compounds selected from the above poly-substituted compounds.

Among the above o-quinonediazide compounds, from the viewpoint that the balance of the difference between the development solubilities of the exposed part and the unexposed part with respect to the coating film obtained using the positive photosensitive resin composition is favorable, and that there is no development residue in a pattern bottom part (residue in a pattern edge part) during the development, preferred are o-quinonediazidesulfonate ester of p-cresol, o-quinonediazidesulfonate ester of 4,4'-(1-(4-(1-(4-hydroxyphenyl)-1-methylethyl) phenyl) ethylidene) bisphenol, o-quinonediazidesulfonate ester of methyl 3,4,5-trihydroxybenzoate ester, o-quinonediazidesulfonate ester of 2,3,4-trihydroxybenzophenone and o-quinonediazidesulfonate ester of 2,3,4,4'-tetrahydroxybenzophenone. These compounds may be used singly or in combination of two or more types arbitrarily selected from these compounds.

The content of the compound (B) generating an acid by light irradiation used in the present invention is not particularly limited. However, from the viewpoint that the difference in the solubility in a developer between the exposed part and the unexposed part with respect to the coating film obtained from the positive photosensitive resin composition of the present invention becomes higher, the content of the compound (B) is preferably 0.01 parts by mass or more, more preferably 10 parts by mass or more, based on 100 parts by mass of the polyhydroxyamide resin (A). In addition, from the viewpoint that the coating film obtained using the composition becomes to have high sensitivity and a cured film obtained from the coating film also becomes to have excellent mechanical properties, the content of the compound (B) generating an acid by light irradiation is preferably 100 parts by mass or less, more preferably 30 parts by mass or less.

(Crosslinkable Compound (C))

The positive photosensitive resin composition of the present invention may contain a crosslinkable compound (C). The crosslinkable compound (C) is not particularly limited so long as it is a compound having a group capable of being reacted with an organic group contained in the polyhydroxyamide resin (A) during a process (hereinafter, referred to as during final-curing) for converting the coating film obtained using the positive photosensitive resin composition to the cured film. Examples of the crosslinkable compound (C) include: compounds having two or more epoxy groups; or melamine derivatives, benzoguanamine derivatives or glycoluril which have a group in which the hydrogen atom of an amino group is replaced by a methylol group, an alkoxymethyl group or both. These melamine derivatives and benzoguanamine derivatives may be a dimer, a trimer or a mixture arbitrarily selected from monomers, dimers and trimers. As these melamine derivatives and benzoguanamine derivatives, preferred are those having methylol groups or alkoxymethylol groups in the number of three or more and less than six in average per triazine ring.

In addition, the crosslinkable compound (C) of the present invention may be used singly or in combination of two or more types thereof.

As the crosslinkable compound (C), commercially available compounds may be used. Commercially available compounds are easily obtained, which is more preferred. The followings are specific examples thereof (trade names). However, the present invention is not limited to these examples.

Examples of the compounds having two or more epoxy groups include epoxy compounds having a cyclohexene structure such as Epolead GT-401, Epolead GT-403, Epolead GT-301, Epolead GT-302, Celloxide 2021 and Celloxide 3000 (manufactured by Daicel Chemical Industries, Ltd.); bisphenol A-type epoxy compounds such as Epikote 1001, Epikote 1002, Epikote 1003, Epikote 1004, Epikote 1007, Epikote 1009, Epikote 1010 and Epikote 828 (manufactured by Japan Epoxy Resins Co., Ltd.); bisphenol F-type epoxy compounds such as Epikote 807 (manufactured by Japan Epoxy Resins Co., Ltd.); phenol novolac-type epoxy compounds such as Epikote 152 and Epikote 154 (manufactured by Japan Epoxy Resins Co., Ltd.) and EPPN 201 and EPPN 202 (manufactured by Nippon Kayaku Co., Ltd.); cresol novolac-type epoxy compounds such as ECON-102, ECON-103S, ECON-104S, ECON-1020, ECON-1025 and ECON-1027 (manufactured by Nippon Kayaku Co., Ltd.) and Epikote 180S75 (manufactured by Japan Epoxy Resins Co., Ltd.); alicyclic epoxy compounds such as Denacol EX-252 (manufactured by Nagase ChemteX Corporation), CY175, CY177, CY179, Araldite CY-182, Araldite CY-192 and Araldite CY-184 (manufactured by CIBA-GEIGY A.G.), Epiclon 200 and Epiclon 400 (manufactured by Dainippon Ink and Chemicals, Incorporated), Epikote 871 and Epikote 872 (manufactured by Japan Epoxy Resins Co., Ltd.) and ED-5661 and ED-5662 (manufactured by Celanese Coating Company); and aliphatic polyglycidylether compounds such as Denacol EX-611, Denacol EX-612, Denacol EX-614, Denacol EX-622, Denacol EX-411, Denacol EX-512, Denacol EX-522, Denacol EX-421, Denacol EX-313, Denacol EX-314 and Denacol EX-312 (manufactured by Nagase ChemteX Corporation).

Examples of the melamine derivatives, the benzoguanamine derivative or the glycourils which have a group in which the hydrogen atom of an amino group are replaced by a methylol group, an alkoxymethyl group or both include MX-750 in which methoxymethyl groups are replaced in a number of 3.7 in average per triazine ring and MW-30 in which methoxymethyl groups are replaced in a number of 5.8 in average per triazine ring (manufactured by Sanwa Chemical Co., Ltd.); or methoxymethylated melamine such as Cymel 300, Cymel 301, Cymel 303, Cymel 350, Cymel 370, Cymel 771, Cymel 325, Cymel 327, Cymel 703 and Cymel 712; methoxymethylated butoxymethylated melamine such as Cymel 235, Cymel 236, Cymel 238, Cymel 212, Cymel 253 and Cymel 254; butoxymethylated melamine such as Cymel 506 and Cymel 508; carboxyl group-containing methoxymethylated isobutoxymethylated melamine such as Cymel 1141; methoxymethylated ethoxymethylated benzoguanamine such as Cymel 1123; methoxymethylated butoxymethylated benzoguanamine such as Cymel 1123-10; butoxymethylated benzoguanamine such as Cymel 1128; carboxyl group-containing methoxymethylated ethoxymethylated benzoguanamine such as Cymel 1125-80 (manufactured by Nihon Cytec Industries Inc. (former, Mitsui Cyanamide Co., Ltd.)); butoxymethylated glycouril such as Cymel 1170; and methylolated glycoluril such as Cymel 1172.

In addition, as the crosslinkable compound (C), from the point that there is no film thickness loss of the coating film obtained using the positive photosensitive resin composition of the present invention during the final curing and the point that the cured film obtained using the positive photosensitive resin composition is advantageous in heat resistance, chemical resistance and film density, epoxy compounds having structural units represented by Formula (21) and Formula (22):

[Chemical Formula 27]

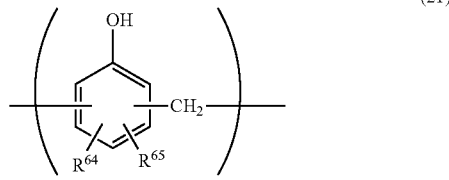
(21)

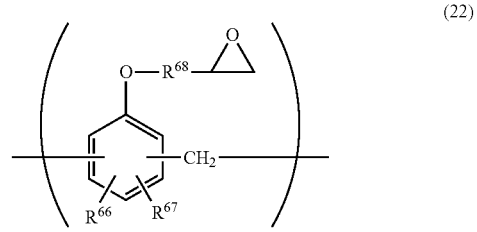
(22)

(where $R^{64}$, $R^{65}$, $R^{66}$ and $R^{67}$ independently represent a hydrogen atom, a hydroxy group or an organic group having 1 to 10 carbon atom(s); and $R^{68}$ represents an alkyl group having 1 to 4 carbon atom(s))
and having two or more structural units represented by Formula (22) are more preferred.

Specific examples of such an epoxy compound include commercially available products such as ECON-102, ECON-103S, ECON-104S, ECON-1020, ECON-1025 and ECON-1027 (manufactured by Nippon Kayaku Co., Ltd.) and Epikote 180S75 (manufactured by Japan Epoxy Resins Co., Ltd.) which fall under a cresol novolac-type epoxy compound.

Among the above epoxy compounds, an epoxy compound having a number average molecular weight of 500 to 10,000 is more preferred. When the epoxy compound has a number average molecular weight of less than 500, mechanical strength, heat resistance and chemical resistance of the cured film obtained using the positive photosensitive resin composition of the present invention may be undermined. On the other hand, when the epoxy compound has a number average molecular weight of more than 10,000, the compatibility of the epoxy compound with the polyhydroxyamide resin (A) may be extremely lowered.

The content of the crosslinkable compound (C) in the positive photosensitive resin composition of the present invention is not particularly limited. However, since the water absorbing properties of the cured film obtained using the positive photosensitive resin composition becomes lower and the heat resistance and the chemical resistance thereof become higher, the content is preferably 1 part by mass or more, more preferably 5 parts by mass or more based on 100 parts by mass of the polyhydroxyamide resin (A). In addition, in terms of not undermining the preservation stability of the positive photosensitive resin composition, the content of the crosslinkable compound (C) is preferably 100 parts by mass or less, more preferably 50 parts by mass or less based on 100 parts by mass of the polyhydroxyamide resin (A).

(Compound for Enhancing Adhesion)

The positive photosensitive resin composition of the present invention may contain an organic silane compound or an aluminum chelate compound for enhancing the adhesion of the coating film and the cured film obtained using the composition to a substrate. As such an organic silane compound and such an aluminum chelate compound, for example commercially available products manufactured by GE Toshiba Silicon Co., Ltd., Shin-Etsu Chemical Co., Ltd., and the like may also be used and are more preferred because such products are easily available.

Examples of the organic silane compound include vinyl triethoxy silane, 3-glycidoxypropyl triethoxy silane, 3-glycidoxypropyl diethoxy silane, 3-glycidoxypropyl ethoxydiethyl silane, 3-glycidoxypropyl trimethoxy silane, 3-glycidoxypropyl dimethoxymethyl silane, 3-glycidoxypropyl methoxydimethyl silane, 3-methacryloxypropyl trimethoxy silane, 3-methacryloxypropyl methoxydimethyl silane, 3-methacryloxypropyl dimethoxymethyl silane, 3-aminopropyl trimethoxy silane, 3-aminopropyl dimethoxymethyl silane, 3-aminopropyl methoxydimethyl silane, 3-aminopropyl triethoxy silane, 3-aminopropyl diethoxyethyl silane and 3-aminopropyl ethoxydiethyl silane.

Examples of the aluminum chelate compound include tris(acetylacetonate) aluminum and acetylacetonate aluminum diisopropylate.

In the present invention, one type selected from the organic silane compounds and the aluminum chelate compounds may be used singly or in combination of two or more types thereof.

Among them, 3-glycidoxypropyl triethoxy silane, 3-glycidoxypropyl trimethoxy silane and 3-aminopropyl triethoxy silane are more preferred.

The content of a compound selected from the organic silane compounds and the aluminum chelate compounds in the positive photosensitive resin composition of the present invention is not particularly limited. However, from the viewpoint that the adhesion of the coating film and the cured film obtained using the positive photosensitive resin composition to a substrate can be satisfactorily enhanced, the content is preferably 0.1 parts by mass or more, more preferably 0.5 parts by mass or more based on 100 parts by mass of the polyhydroxyamide resin (A). In addition, when the content of the compound selected from the organic silane compounds and the aluminum chelate compounds is 30 parts by mass or less, the preservation stability of the positive photosensitive resin composition is favorable and there is no residue in the bottom part of a pattern obtained using the composition, which is preferred and the content of 20 parts by mass or less is more preferred.

(Surfactant)

The positive photosensitive resin composition of the present invention may further contain a surfactant for enhancing the coating properties and the uniformity of the surface of the coating film formed by applying the composition. The surfactant used for this purpose is not particularly limited and fluorinated surfactants, silicon-based surfactants, nonionic surfactants and the like may be used. As these surfactants, for example, commercially available products manufactured by Sumitomo 3M Limited, Dainippon Ink and Chemicals, Incorporated, Asahi Glass Co., Ltd., and the like are preferred because such products are easily available.

Among them, the fluorinated surfactant is preferred because the fluorinated surfactant has high enhancing effect of coating properties. More preferred examples of the fluorinated surfactant include EFTOP EF301, EFTOP EF303 and EFTOP EF352 (manufactured by JEMCO, Inc.), MEGAFAC F171, MEGAFAC F173 and MEGAFAC R-30 (manufactured by Dainippon Ink and Chemicals, Incorporated), Fluorad FC 430 and Fluorad FC431 (manufactured by Sumitomo 3M Limited) and Asahi Guard AG 710, Surflon S-382, Surflon SC 101, Surflon SC 102, Surflon SC 103, Surflon SC 104, Surflon SC 105 and Surflon SC 106 (manufactured by Asahi Glass Co., Ltd.).

The content of the surfactant used in the positive photosensitive resin composition of the present invention is not particularly limited. However, when the content is less than 0.01 parts by mass based on 100 parts by mass of the polyhydroxyamide resin (A), the enhancing effect of the coating properties may not be obtained. Therefore, the content of the surfactant is preferably 0.01 parts by mass or more, more preferably 0.05 parts by mass or more based on 100 parts by mass of the polyhydroxyamide resin (A). On the other hand, when the content of the surfactant is more than 15 parts by mass based on 100 parts by mass of the polyhydroxyamide resin (A), the uniformity of the surface of the coating film may not be obtained. Therefore, the content of the surfactant is preferably 15 parts by mass or less, more preferably 10 parts by mass or less based on 100 parts by mass of the polyhydroxyamide resin (A).

(Organic Solvent)

The positive photosensitive resin composition of the present invention is usually dissolved in an organic solvent to be used in a varnish form. The organic solvent used in a varnish containing the positive photosensitive resin composition of the present invention is not particularly limited so long as the solvent can homogeneously dissolve the polyhydroxyamide resin (A), the compound (B) generating an acid by light irradiation, the crosslinkable compound (C) blended if necessary, the compound for enhancing the adhesion, the surfactant or the like, and these components can be compatibilized with each other in the solvent.

Specific examples of the organic solvent include acetone, methanol, ethanol, isopropyl alcohol, methoxymethyl pentanol, dipentene, ethyl amyl ketone, methyl nonyl ketone, methyl ethyl ketone, methyl isoamyl ketone, methyl isopropyl ketone, methyl cellosolve, ethyl cellosolve, butyl cellosolve, methyl cellosolve acetate, ethyl cellosolve acetate, butyl carbitol, butyl carbitol acetate, ethyl carbitol, ethyl carbitol acetate, ethylene glycol, ethylene glycol monoacetate, ethylene glycol monoisopropyl ether, ethylene glycol monobutyl ether, propylene glycol, propylene glycol monoacetate, propylene glycol monomethyl ether, propylene glycol monomethyl ether acetate, propylene glycol tert-butyl ether, diethylene glycol, diethylene glycol monoacetate, diethylene glycol dimethyl ether, dipropylene glycol monoacetate monomethyl ether, dipropylene glycol monomethyl ether, dipropylene glycol monoethyl ether, dipropylene glycol monoacetate monoethyl ether, dipropylene glycol monopropyl ether, dipropylene glycol monopropyl ether acetate, 3-methyl-3-methoxybutyl acetate, tripropylene glycol methyl ether, 3-methyl-3-methoxybutanol, diisopropyl ether, ethyl isobutyl ether, diisobutylene, amyl acetate, butyl butylate, butyl ether, diisobutyl ketone, methylcyclohexene, propyl ether, dihexyl ether, dioxane, N,N-dimethylacetamide, N,N-dimethylformamide, N-methyl-2-pyrrolidone, N-vinyl pyrrolidone, dimethyl sulfoxide, N-methyl pyrrolidone, γ-butyrolactone, n-hexane, n-pentane, n-octane, 2-methoxyethanol, 2-ethoxyethanol, 2-butoxyethanol, diethyl ether, cyclohexanone, methyl lactate, ethyl lactate, butyl lactate, methyl acetate, ethyl acetate, n-butyl acetate, propylene glycol acetate monoethyl ether, methyl pyruvate, ethyl pyruvate, methyl 3-methoxypropionate, methyl 3-ethoxypropionate, methyl 3-methoxypropionate, 3-ethoxypropionic acid, 3-methoxypropionic acid, propyl 3-methoxypropionate, butyl 3-methoxypropionate and diglyme.

These organic solvents may be used singly or in an appropriate combination of two or more types thereof.

Among them, in terms of being easily handled for the positive photosensitive resin composition, as the organic solvent, preferred is one type or a mixture of two or more types selected from methyl ethyl ketone, butylcellosolve, propylene glycol monomethyl ether, propylene glycol monomethyl ether acetate, dipropylene glycol monomethyl ether, N,N-dimethylacetoamide, N-methylpyrrolidone, γ-butylolactone, ethyl lactate, and butyl lactate.

(Positive Photosensitive Resin Composition)

The method for obtaining the positive photosensitive resin composition of the present invention is not particularly limited. Since a composition of this type is usually used in a varnish form, the positive photosensitive resin composition of the present invention is generally prepared by dissolving the polyhydroxyamide resin (A), the compound (B) generating an acid by light irradiation, and, as desired other components such as the crosslinkable compound (C), in an organic solvent.

At this time, for example, a coumarin dimer component and a diamine component as monomers constituting the polyhydroxyamide resin (A) may be subjected to a polymerization reaction in an organic solvent and the obtained reaction solution may be used as it is.

In addition, when a plurality of types of organic solvents is used, a plurality of types of organic solvents may be mixed before use, or may be separately added as appropriate.

The concentration of the solid content in the positive photosensitive resin composition of the present invention is not particularly limited so long as each component is homogeneously dissolved. Generally, when a solution of the positive photosensitive resin composition is used at a solid content concentration arbitrarily selected from a range of solid content concentration of 1% to 50% by mass, the coating film can be easily formed.

(Coating Film and Cured Film)

Generally, the coating film containing the positive photosensitive resin composition of the present invention can be formed, for example, by applying the positive photosensitive resin composition of the present invention on a silicon wafer, a glass plate, a ceramic substrate, or a substrate having an oxide film or a nitride film, using a known method such as spin-coating, immersing, and printing, and then predrying the composition at a temperature of 60° C. to 160° C., preferably 70° C. to 130° C.

After the formation of the coating film, the coating film is exposed to an ultraviolet (UV) ray or the like using a mask having a predetermined pattern, and the film is developed with an alkaline developer to wash away an exposed part. As a result of this, a relief pattern having a sharp (distinct) edge face is formed on a substrate. The developer used in this process is not particularly limited so long as the developer is an alkaline aqueous solution, and examples thereof include an aqueous solution of an alkali metal hydroxide such as potassium hydroxide, sodium hydroxide, potassium carbonate and sodium carbonate; an aqueous solution of quaternary ammonium hydroxide such as tetramethylammonium hydroxide, tetraethylammonium hydroxide and choline; and an aqueous solution of amine such as ethanolamine, propylamine and ethylenediamine.

As the alkaline developer, generally an alkaline aqueous solution of 10% by mass or less is used, and industrially, an alkaline aqueous solution of 0.1% to 3.0% by mass is used. In addition, the alkaline developer may contain alcohols, a surfactant, or the like, preferably in an amount of around 0.05% to 10% by mass.

In the developing process, the temperature of the alkaline developer can be arbitrarily selected. However, when the positive photosensitive resin composition of the present invention is used, the solubility of an exposed part is high, so that the development using the alkaline developer can be easily performed at room temperature.

Thus, by subjecting the obtained substrate having the relief pattern to a heating treatment (calcination) at a temperature of 180° C. to 400° C., the cured film can be formed with the relief pattern, having excellent electric properties due to low water absorbing properties, and favorable heat resistance and chemical resistance.

Since the cured film obtained from the positive photosensitive resin composition of the present invention has such advantageous effects, the film can be used in electric/electronic devices, semiconductor devices, display devices and the like.

Particularly, since the cured film obtained from the positive photosensitive resin composition of the present invention has such a characteristic effect that the cured film contains no inorganic ion, it is very useful in an insulating film and a diaphragm material for an organic electroluminescent (EL) element or a light-emitting diode (LED), in which a damage of a light-emitting element caused by inorganic ions becomes a serious problem, or in a buffer coating largely affected by the presence or absence of ion-migration of inorganic ions in a copper wiring in a semiconductor package.

EXAMPLES

Hereinafter, the present invention will be described in more detail referring to Examples. However, the present invention is not limited to these examples.

Abbreviations Used in Examples

The meanings of the abbreviations used in Examples are as follows.

(Solvent)
PGME: propylene glycol monomethyl ether
NMP: N-methylpyrrolidone
DMAc: N,N'-dimethylacetamide
(Amines)
BAHF: 2,2'-bis(3-amino-4-hydroxyphenyl) hexafluoropropane
BAPF: bis(3-amino-4-hydroxyphenyl) methane
AHPK: 3,3'-diamino-4,4'-dihydroxybenzophenone
AHPE: 3,3'-diamino-4,4'-dihydroxy-phenylether
BAPA: 2,2'-bis(3-amino-4-hydroxyphenyl) propane
AHPA: (3-amino-4-hydroxy) phenyl (3-amino-4-hydroxy) anilide
BSDA: bis(3-amino-4-hydroxyphenyl) sulfide
APDS: bis(3-aminopropyl)-1,1,3,3-tetramethyldisiloxane
ODA: 4,4'-diaminodiphenylether
DA4P: 1,3-bis(4-aminophenoxy) benzene
ABA: 4-aminobenzylamine
DHCM: 4,4'-diamino-3,3'-dimethylcyclohexylmethane
(Ester Cyclized Product)
CD: coumarin dimer
(Photosensitizer and Others)
P200: (manufactured by Toyo Gosei Co., Ltd.; trade name: P-200; a photosensitizer synthesized by a condensation reaction of 1 mol of 4,4'-(1-(4-(1-(4-hydroxyphenyl)-1-methylethyl) phenyl) ethylidene) bisphenol and 2 mol of 1,2-naphthoquinone-2-diazide-5-sulfonyl chloride)
TMAH: 2.38% by weight tetramethylammonium hydroxide aqueous solution (Measurement of Number Average Molecular Weight and Weight Average Molecular Weight)

The weight average molecular weight (hereinafter, abbreviated as Mw) and the molecular weight distribution of the polymer were measured using a GPC device (Shodex (registered trademark) column KF803L and KF805L; manufactured by JASCO Corporation) under a condition that dimethylformamide as an eluting solvent was flowed at a flow rate of 1 ml/minute at a column temperature of 50° C. Here, Mw is represented as a polystyrene converted value.

Synthesis Example

Synthesis Example: Synthesis of Polyhydroxyamide (P1)

1.12 g (0.0056 mol) of ODA, 0.51 g (0.0014 mol) of BAHF and 2.05 g (0.007 mol) of CD were dissolved in 13.5 g of NMP, and the reaction was effected at 100° C. for 24 hours. Mw and the molecular weight distribution of the obtained polymer were found to be 15,000 and 1.96, respectively. In addition, 1.00 g of the obtained polymer solution was transferred into an aluminum cup and was heated on a hot plate at 200° C. for 2 hours to calculate the solid content. The calculated solid content was 19.91% by weight. The obtained polymer was soluble in TMAH.

Synthesis Example: Synthesis of Polyhydroxyamides (P2 to P10)

In substantially the same manner as in Synthesis Example 1, various diamines and ester cyclized products were reacted in a solvent to synthesize polymers. The type and the amount used of diamines, ester cyclized products and solvents which were used in the reaction, Mw and molecular weight distribution of the obtained polymers, and the solid content are shown in Table 1. The obtained polymers were soluble in TMAH.

Comparative Synthesis Example: Synthesis of Polyhydroxyamide (H1)

1.00 g (0.005 mol) of ODA and 1.62 g (0.005 mol) of CD were dissolved in 10.49 g of DMAc and the reaction was effected at 90° C. for 24 hours. Mw and the molecular weight distribution of the obtained polymer were found to be 7,000 and 1.73, respectively. In addition, 1.00 g of the obtained polymer solution was transferred into an aluminum cup and was heated on a hot plate at 200° C. for 2 hours to calculate the solid content. The calculated solid content was 20.93% by weight. The obtained polymer was soluble in TMAH.

Comparative Synthesis Example: Synthesis of Polyhydroxyamides (H2 and H3)

In substantially the same manner as in Comparative Example 1, various diamines and ester cyclized products were reacted in a solvent to synthesize polymers. The type and amount used of diamines, ester cyclized products and solvents which were used in the reaction, Mw and molecular weight distribution of the obtained polymers, and the solid content are shown in Table 1. Here, the obtained polymers were insoluble in TMAH, so that the polymers were not used in the subsequent preparation and evaluation of positive photosensitive resin compositions.

TABLE 1

Polymer composition and molecular weight

| Polymer solution | Ester cyclized product | Diamine 1 | Diamine 2 | Diamine 3 | Solvent used (g) | Molecular weight (Mw) | Molecular weight distribution (Mw/Mn) | Solid content (%) |
|---|---|---|---|---|---|---|---|---|
| P1 | CD (2.05) | ODA (1.12) | BAHF (0.51) | — | NMP (13.5) | 15,000 | 1.96 | 20.93 |
| P2 | CD (1.76) | ODA (0.60) | BAHF (0.59) | APDS (0.149) | NMP (12.4) | 3,100 | 1.52 | 19.99 |
| P3 | CD (1.76) | ODA (0.72) | BAPF (0.55) | — | NMP (12.2) | 2,000 | 1.33 | 20.01 |
| P4 | CD (1.76) | ODA (0.72) | AHPK (0.59) | — | NMP (12.2) | 4,100 | 1.69 | 19.99 |
| P5 | CD (1.76) | ODA (0.72) | AHPE (0.56) | — | NMP (12.1) | 4,000 | 1.97 | 19.98 |
| P6 | CD (1.76) | AHPE (1.38) | — | — | NMP (7.51) | 5,200 | 1.75 | 29.95 |
| P7 | CD (1.76) | BAPA (1.20) | — | — | NMP (6.89) | 4,900 | 1.57 | 29.99 |
| P8 | CD (1.76) | AHPA (1.56) | — | — | NMP (7.72) | 5,400 | 1.58 | 29.93 |
| P9 | CD (2.05) | ODA (1.43) | BSDA (0.58) | — | NMP (16.3) | 4,000 | 1.58 | 19.93 |
| P10 | CD (2.05) | DA4P (1.22) | BAHF (1.02) | — | NMP (17.1) | 3,600 | 1.59 | 19.96 |
| H1 | CD (1.46) | ODA (1.00) | — | — | DMAc (9.85) | 13,300 | 1.33 | 19.99 |
| H2 | CD (1.46) | DHCM (1.83) | — | — | DMAc (10.6) | 37,000 | 1.80 | 23.68 |
| H3 | CD (1.46) | ABA (0.610) | — | — | NMP (8.29) | 4,600 | 1.74 | 19.91 |

(Preparation of Positive Photosensitive Resin Composition)

In the compositions shown in Table 2, polymer solutions (P1 to P10 and H1), a photosensitizer (P200) and 0.0002 g of a fluorinated surfactant (manufactured by Dainippon Ink and Chemicals, Incorporated; MEGAFAC R-30) were mixed and the resultant mixture was stirred at room temperature for 3 hours or more to prepare positive photosensitive resin compositions.

TABLE 2

| | | Varnish composition | | |
|---|---|---|---|---|
| No. | Polymer solution | Polymer solution (amount used (g)) | Photoensitizer (P200) (amount used (g)) | Solvent added (type: amount (g)) |
| Example 1 | P1 | 4.0 | 0.398 | PGME: 3.03 |
| Example 2 | P2 | 3.5 | 0.350 | PGME: 2.29 |
| Example 3 | P3 | 3.5 | 0.350 | PGME: 2.29 |
| Example 4 | P4 | 3.5 | 0.350 | PGME: 2.29 |
| Example 5 | P5 | 3.5 | 0.351 | PGME: 2.29 |
| Example 6 | P6 | 3.0 | 0.448 | PGME: 2.29 |
| Example 7 | P7 | 3.0 | 0.448 | NMP: 4.45 |
| Example 8 | P8 | 3.0 | 0.446 | NMP: 4.45 |
| Example 9 | P9 | 4.0 | 0.399 | PGME: 2.62 |
| Example 10 | P10 | 3.5 | 0.350 | PGME: 2.30 |
| Comparative Example 1 | H1 | 4.0 | 0.401 | PGME: 3.03 |

(Development Evaluation)

The positive photosensitive resin compositions obtained according to Table 2 were evaluated by the following methods. The used developing conditions and the evaluation results are shown in Table 3.

(Production of Coating Film in which Pattern is Formed)

The positive photosensitive resin compositions of Examples 1 to 10 and Comparative Example 1 were applied on indium tin oxide (ITO) substrates (manufactured by Sanyo Vacuum Industries Co., Ltd.) having a step part of 50 mm×50 mm using a spin coater. Subsequently, the compositions were prebaked on a hot plate at a temperature of 100° C. for 120 seconds to form coating films. The film thickness at this time is shown in Table 3 as "film thickness before curing". Here, for the measurement of the film thickness, a contact film thickness measuring apparatus (Dektak 3 ST; manufactured by ULVAC, Inc.) was used.

A UV light was irradiated to the obtained coating films by an ultraviolet irradiation device (PLA-600; manufactured by Cannon Inc.) through a test mark of line/space, on which 1/1 to 100/100 are described, for 16 seconds (100 mJ/cm$^2$). After the exposure, the coating films were immersed in 2.38% by weight TMAH and developed, and then subjected to a cleaning process using pure water for 20 seconds to obtain coating films in which patterns are formed. At this time, the time for the development was employed as shown in Table 3 in each Example and Comparative Example as developing time.

Then, the film thickness of an unexposed part after the development was measured by the above contact film thickness measuring apparatus. The measured film thickness is shown in Table 3 as "film thickness after development".

(Resolution)

The coating film after the development was observed by a microscope to confirm the minimum line/space size of the obtained pattern. The pattern size is shown in Table 3.

TABLE 3

| | Development evaluation | | | | |
|---|---|---|---|---|---|
| No. | Film thickness before curing (μm) | Developing time (second) | Film thickness after development (μm) | Pattern size (μm) | Developing properties * |
| Example 1 | 0.716 | 30 | 0.699 | 20 | A |
| Example 2 | 1.031 | 20 | 1.030 | 10 | A |
| Example 3 | 1.533 | 20 | 0.836 | 10 | A |
| Example 4 | 1.305 | 10 | 0.933 | 20 | B |
| Example 5 | 1.181 | 20 | 0.853 | 20 | B |
| Example 6 | 3.699 | 30 | 1.107 | 40 | C |
| Example 7 | 2.052 | 10 | 0.683 | 50 | C |
| Example 8 | 1.670 | 10 | 0.591 | 50 | C |
| Example 9 | 1.261 | 50 | 1.260 | 10 | A |
| Example 10 | 1.042 | 40 | 1.040 | 10 | A |
| Comparative Example 1 | 0.722 | 40 | 0.726 | — | D |

* Evaluation of developing properties:
A: Positive pattern of 10 μm or less can be formed.
B: Positive pattern of around 10 μm to 20 μm can be formed.
C: Positive pattern of around 20 μm to 50 μm can be formed.
D: Exposed part cannot be entirely removed, so that the pattern formation is impossible.

In Examples 1 to 10, in the exposed part, there was no development residue of the pattern bottom part (residue in the pattern edge part) and all advantageous positive patterns were obtained.

On the other hand, in Comparative Example 1, although a film thickness loss in the unexposed part was not observed, in the pattern bottom part of the exposed part, there were observed many development residues, so that the pattern formation was failed.

The invention claimed is:

1. A method for manufacturing a polyhydroxyamide resin (A) containing no chloride, the method comprising:
reacting a coumarin dimer component of Formula (19),

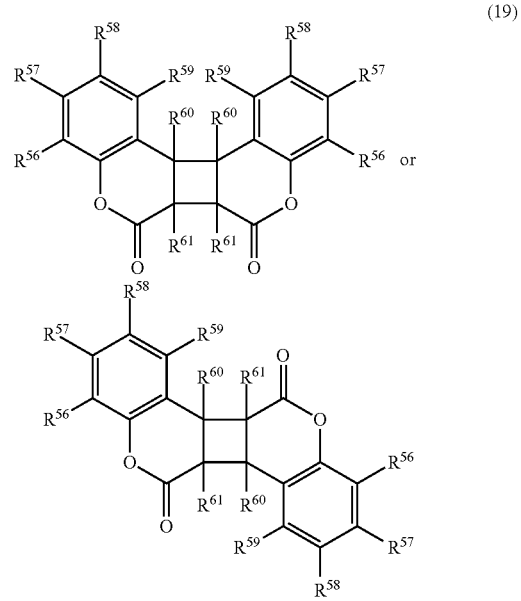

where $R^{56}$, $R^{57}$, $R^{58}$, $R^{59}$, $R^{60}$ and $R^{61}$ independently represent an alkyl group having 1 to 10 carbon atom(s), a halogen atom, a nitro group, an amino group, a cyano group, a carboxy group, an alkoxycarbonyl group having 1 to 10 carbon atom(s), a halogenated alkyl group having 1 to 10 carbon atom(s) or a hydroxy group, and a diamine (DA-1) selected from the group consisting of 4,4'-dihydroxybenzidine (3BP), 3,3'-diamino-4,4'-dihydroxybiphenyl (4BP), 3,3'-diamino-2,2'-dihydroxybiphenyl (2BP), 2,2'-bis(3-amino-4-hydroxyphenyl) hexafluoropropane (BAHF), 2,2-bis(4-amino-3,5-dihydroxyphenyl) hexafluoropropane, 2,2-bis(4-(3-amino-4-hydroxyphenoxy) phenyl) hexafluoropropane, bis(3-amino-4-hydroxyphenyl) methane (BAPF), 3,3'-diamino-4,4'-dihydroxybenzophenone (AHPK), 3,3'-diamino-4,4'-dihydroxy-phenyl ether (AHPE), 3,3'-diamino-4,4'-dihydroxy-thiophenyl ether, 2,2'-bis(3-amino-4-hydroxyphenyl) propane (BAPA), (3-amino-4-hydroxy) phenyl (3-amino-4-hydroxy) anilide (AHPA), bis(3-amino-4-hydroxyphenyl) sulfone (BSDA), (4-(4-aminophenoxy) phenyl) sulfone, 2,4-diaminophenol, 3,5-diaminophenol, 2,5-diaminophenol, 4,6-diaminoresorcinol, 2,5-diaminohydroquinone, bis(3-amino-4-hydroxyphenyl) thioether, bis(4-amino-3,5-dihydroxyphenyl) thioether, bis(3-amino-4-hydroxyphenyl) ether, bis(4-amino-3,5-dihydroxyphenyl) ether, bis(3-amino-4-hydroxyphenyl) methane, bis(4-amino-3,5-dihydroxyphenyl) methane, bis(3-amino-4-hydroxyphenyl) sulfone, bis(4-amino-3,5-dihydroxyphenyl) sulfone, 4,4'-diamino-3,3'-dihydroxybiphenyl, 4,4'-diamino-3,3'-dihydroxy-5,5'-dimethylbiphenyl, 4,4'-diamino-3,3'-dihydroxy-5,5'-dimethoxybiphenyl, 1,4-bis(3-amino-4-hydroxyphenoxy) benzene, 1,3-bis(3-amino-4-hydroxyphenoxy) benzene, 1,4-bis(4-amino-3-hydroxyphenoxy) benzene, 1,3-bis(4-amino-3-hydroxyphenoxy) benzene, bis(4-(3-amino-4-hydroxyphenoxy) phenyl) sulfone, bis(4-(3-amino-4-hydroxyphenoxy) phenyl) propane, and 1,4-bis(4-aminophenoxy) benzene, and a diamine (DA-2) selected from the group consisting of 4,4'-diaminodiphenylether and 1,3-bis(4-aminophenoxy) benzene, in a polar solvent.

2. A cured film produced by using the resin (A) manufactured by the method according to claim 1.

3. A method for manufacturing a cured film, the method comprising the steps of:

applying the resin (A) manufactured by the method according to claim 1; and predrying the applied resin (A).

4. A method for manufacturing a polyhydroxyamide resin (A) containing no chloride, the method comprising:

reacting a coumarin dimer component of Formula (19),

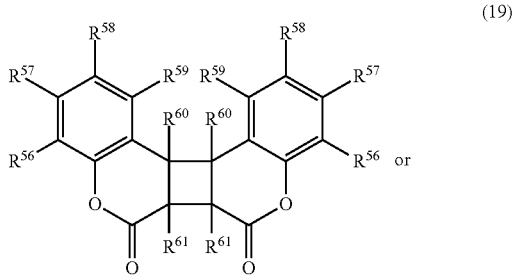

(19)

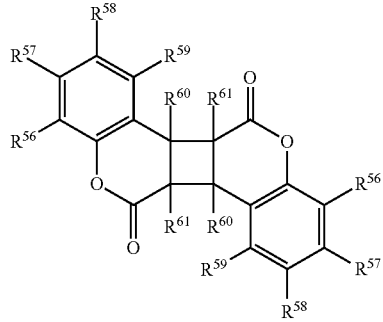

-continued where $R^{56}$, $R^{57}$, $R^{58}$, $R^{59}$, $R^{60}$ and $R^{61}$ independently represent an alkyl group having 1 to 10 carbon atom(s), a halogen atom, a nitro group, an amino group, a cyano group, a carboxy group, an alkoxycarbonyl group having 1 to 10 carbon atom(s), a halogenated alkyl group having 1 to 10 carbon atom(s) or a hydroxy group, and a diamine (DA-1) selected from the group consisting of 4,4'-dihydroxybenzidine (3BP), 3,3'-diamino-4,4'-dihydroxybiphenyl (4BP), 3,3'-diamino-2,2'-dihydroxybiphenyl (2BP), 2,2-bis(4-amino-3,5-dihydroxyphenyl) hexafluoropropane, 2,2-bis(4-(3-amino-4-hydroxyphenoxy) phenyl) hexafluoropropane, bis(3-amino-4-hydroxyphenyl) methane (BAPF), 3,3'-diamino-4,4'-dihydroxybenzophenone (AHPK), 3,3'-diamino-4,4'-dihydroxy-phenyl ether (AHPE), 3,3'-diamino-4,4'-dihydroxy-thiophenyl ether, 2,2'-bis(3-amino-4-hydroxyphenyl) propane (BAPA), (3-amino-4-hydroxy) phenyl (3-amino-4-hydroxy) anilide (AHPA), bis(3-amino-4-hydroxyphenyl) sulfone (BSDA), (4-(4-aminophenoxy) phenyl) sulfone, 2,4-diaminophenol, 3,5-diaminophenol, 2,5-diaminophenol, 4,6-diaminoresorcinol, 2,5-diaminohydroquinone, bis(3-amino-4-hydroxyphenyl) thioether, bis(4-amino-3,5-dihydroxyphenyl) thioether, bis(3-amino-4-hydroxyphenyl) ether, bis(4-amino-3,5-dihydroxyphenyl) ether, bis(3-amino-4-hydroxyphenyl) methane, bis(4-amino-3,5-dihydroxyphenyl) methane, bis(3-amino-4-hydroxyphenyl) sulfone, bis(4-amino-3,5-dihydroxyphenyl) sulfone, 4,4'-diamino-3,3'-dihydroxybiphenyl, 4,4'-diamino-3,3'-dihydroxy-5,5'-dimethylbiphenyl, 4,4'-diamino-3,3'-dihydroxy-5,5'-dimethoxybiphenyl, 1,4-bis(3-amino-4-hydroxyphenoxy) benzene, 1,3-bis(3-amino-4-hydroxyphenoxy) benzene, 1,4-bis(4-amino-3-hydroxyphenoxy) benzene, 1,3-bis(4-amino-3-hydroxyphenoxy) benzene, bis(4-(3-amino-4-hydroxyphenoxy) phenyl) sulfone, bis(4-(3-amino-4-hydroxyphenoxy) phenyl) propane, and 1,4-bis(4-aminophenoxy) benzene, in a polar solvent.

5. The method according to claim 4, further comprising:

reacting the coumarin dimer with a diamine (DA-2) selected from the group consisting of p-phenylenediamine, m-phenylenediamine, 2,4,6-trimethyl-1,3-phenylenediamine, 2,3,5,6-tetramethyl-1,4-phenylenediamine, 4,4'-diaminodiphenylether, 3,4'-diaminodiphenylether, 3,3'-diaminodiphenylether, 4,4'-diaminodiphenylsulfide, 4,4'-diaminodiphenylmethane, 3,4'-diaminodiphenylmethane, 3,3'-diaminodiphenylmethane, 4,4-methylene-bis(2-methylaniline), 4,4'-methylene-bis(2,6-dimethylaniline), 4,4-methylene-bis(2,6- diethylaniline), 4,4'-methylene-bis(2-isopropyl-6-methylaniline), 4,4'-methylene-bis(2,6-diisopropylaniline), 4,4'-diaminodiphenylsulfone, 3,3'-diaminodiphenylsulfone, benzidine, o-tolidine, m-tolidine, 3,3',5,5'-tetramethylbenzidine, 1,4-bis(4-aminophenoxy) benzene, 1,3-bis(4-aminophenoxy) benzene, 1,3-bis(3-aminophenoxy) benzene, bis(4-(4-aminophenoxy) phenyl) sulfone, bis(4-(3-aminophenoxy) phenyl) sulfone, 2,2-bis(4-(4-aminophenoxy) phenyl) propane, and 2,2-bis(4-(3-aminophenoxy) phenyl) propane.

6. A cured film produced by using the resin (A) manufactured by the method according to claim 5.

7. A method for manufacturing a cured film, the method comprising the steps of:

applying the resin (A) manufactured by the method according to claim 5; and predrying the applied resin (A).

* * * * *